US012740447B2

(12) United States Patent
Hwang et al.

(10) Patent No.: US 12,740,447 B2
(45) Date of Patent: Sep. 15, 2026

(54) SEMICONDUCTOR PACKAGES HAVING CONDUCTIVE PATTERNS INCLUDING WIRING PATTERNS AND UNDER-BUMP PATTERNS, AND METHODS OF FABRICATING THE SAME

(71) Applicant: Samsung Electronics Co., Ltd., Suwon-si (KR)

(72) Inventors: Hyeonjeong Hwang, Cheonan-si (KR); Minjung Kim, Cheonan-si (KR); Jongyoun Kim, Seoul (KR); Seokhyun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1107 days.

(21) Appl. No.: 17/846,777

(22) Filed: Jun. 22, 2022

(65) Prior Publication Data

US 2023/0109448 A1 Apr. 6, 2023

(30) Foreign Application Priority Data

Oct. 1, 2021 (KR) ........................ 10-2021-0130846

(51) Int. Cl.
*H10W 70/65* (2026.01)
*H10W 70/05* (2026.01)
(Continued)

(52) U.S. Cl.
CPC ........... *H10W 70/65* (2026.01); *H10W 70/05* (2026.01); *H10W 70/095* (2026.01);
(Continued)

(58) Field of Classification Search
CPC ........... H01L 23/49838; H01L 21/4857; H01L 21/486; H01L 23/49816; H01L 23/49822;
(Continued)

(56) References Cited

U.S. PATENT DOCUMENTS 8,907,487 B2 12/2014 Kim et al.
9,460,951 B2 10/2016 Lin
(Continued)

FOREIGN PATENT DOCUMENTS

CN 111293090 A 6/2020
KR 20130139600 A 12/2013
(Continued)

*Primary Examiner* — Michael Jung
(74) *Attorney, Agent, or Firm* — Fish & Richardson P.C.

(57) ABSTRACT

Disclosed are semiconductor packages and fabrication methods thereof. The semiconductor package may include a lower substrate, a lower semiconductor chip, a redistribution layer, an upper semiconductor chip, and a through electrode. The lower substrate may include a first dielectric layer, a first conductive pattern having a wiring pattern and an under-bump pattern, a second dielectric layer, and a second conductive pattern. The under-bump pattern may include a first head part and a first tail part. The first head part may have a first lateral surface on the first dielectric layer that is inclined to a top surface of the first dielectric layer. The second conductive pattern may have a second lateral surface on the second dielectric layer that is perpendicular to a top surface of the second dielectric layer.

19 Claims, 13 Drawing Sheets

(51) Int. Cl.

| | |
|---|---|
| ***H10W 70/685*** | (2026.01) |
| ***H10W 90/00*** | (2026.01) |
| *H10W 70/60* | (2026.01) |
| *H10W 74/00* | (2026.01) |
| *H10W 74/15* | (2026.01) |

(52) U.S. Cl.
CPC ......... *H10W 70/685* (2026.01); *H10W 90/00* (2026.01); *H10W 90/701* (2026.01); *H10W 70/60* (2026.01); *H10W 74/00* (2026.01); *H10W 74/15* (2026.01); *H10W 90/401* (2026.01); *H10W 90/722* (2026.01); *H10W 90/724* (2026.01); *H10W 90/734* (2026.01)

(58) Field of Classification Search
CPC .. H01L 25/0652; H01L 25/105; H10W 70/65; H10W 90/701; H10W 70/685; H10W 90/00; H10W 70/095; H10W 70/05
See application file for complete search history.

(56) References Cited

U.S. PATENT DOCUMENTS

| | | | | |
|---|---|---|---|---|
| 10,128,179 | B2 | 11/2018 | Kim et al. | |
| 10,256,114 | B2 | 4/2019 | Huemoeller et al. | |
| 10,504,836 | B2 | 12/2019 | Kuroyanagi et al. | |
| 10,522,438 | B2 | 12/2019 | Cheng et al. | |
| 10,573,589 | B2 | 2/2020 | Kim et al. | |
| 10,665,535 | B2 | 5/2020 | Lee et al. | |
| 10,833,002 | B2 | 11/2020 | Kim | |
| 11,094,636 | B2 | 8/2021 | Jang et al. | |
| 2016/0071820 | A1* | 3/2016 | Yu | H01L 23/3107 257/737 |
| 2017/0365587 | A1* | 12/2017 | Hung | H01L 21/486 |
| 2019/0139896 | A1* | 5/2019 | Hsu | H01L 23/5384 |
| 2020/0185314 | A1 | 6/2020 | Kim | |
| 2021/0050292 | A1 | 2/2021 | Kim | |
| 2022/0367210 | A1* | 11/2022 | Lin | H01L 24/24 |

FOREIGN PATENT DOCUMENTS

| | | | |
|---|---|---|---|
| KR | 20170054875 | A | 5/2017 |
| KR | 10-1787840 | B1 | 10/2017 |
| KR | 20190096562 | A | 8/2019 |
| KR | 102029099 | B1 | 10/2019 |
| KR | 10-2020-0058129 | A | 5/2020 |
| KR | 10-2020-0068958 | A | 6/2020 |
| KR | 20200134104 | A | 12/2020 |

* cited by examiner 560
540
530
520
510
422
426
424
410
420
150
142
144
140
130
122
124
120
110
102
RL2
RL1
105
155
160
552
554
550
202
204
200
124
122
120
144
142
140
300
500
400
430
100

CS
900
800
720
710
730
724
722
726
714
712
704
716
100
802
804
806
150
140
130
120
110
RL2
RL1
604
600
160
602
105
144
142
124
122
102

140
130
120
110
1000
RL2
RL1
135
124
122
146
148
144
140
142
h2
115

150
140
130
120
110
1000
RL2
RL1
146
148
144
142
135
124
122
115

SEMICONDUCTOR PACKAGES HAVING CONDUCTIVE PATTERNS INCLUDING WIRING PATTERNS AND UNDER-BUMP PATTERNS, AND METHODS OF FABRICATING THE SAME

CROSS-REFERENCE TO RELATED APPLICATION

This U.S. nonprovisional application claims priority under 35 U.S.C. § 119 to Korean Patent Application No. 10-2021-0130846, filed on Oct. 1, 2021 in the Korean Intellectual Property Office, the disclosure of which is hereby incorporated by reference in its entirety.

BACKGROUND

1. Field

The present inventive concepts relate to semiconductor packages and/or methods of fabricating the same, and more particularly, to semiconductor packages including a wiring structure and/or methods of fabricating the same.

2. Description of the Related Art

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board.

With the development of electronic industry, electronic products have increasing demands for high performance, high speed, and compact size. To cope with these demands, there may be required a reliable redistribution technique for manufacturing a semiconductor device or package with high-speed transfer and minimum size.

A size of semiconductor chip becomes smaller with high integration of the semiconductor chip. However, an increase in integration of semiconductor chips may induce an increase in density of wiring lines in redistribution and thus various issues are generated.

SUMMARY

Some example embodiments of the present inventive concepts provide semiconductor packages with increased structural stability and/or methods of fabricating the same.

Some example embodiments of the present inventive concepts provide semiconductor packages with improved electrical properties and enhanced drive reliability and/or methods of fabricating the same.

Some example embodiments of the present inventive concepts provide semiconductor package fabrication methods with low failure rate and/or semiconductor packages fabricated by the same.

According to an example embodiment of the present inventive concepts, a semiconductor package includes a lower substrate, a lower semiconductor chip mounted on the lower substrate, a redistribution layer on the lower semiconductor chip, an upper semiconductor chip mounted on the redistribution layer, and a through electrode on one side of the lower semiconductor chip, the through electrode connecting the lower substrate to the redistribution layer. The lower substrate may include a first dielectric layer, a first conductive pattern on the first dielectric layer, the first conductive pattern having a wiring pattern and an under-bump pattern, the wiring pattern and the under-bump pattern being horizontally spaced apart from each other, a second dielectric layer on the first dielectric layer, the second dielectric layer covering the first conductive pattern, and a second conductive pattern on the second dielectric layer. The under-bump pattern may include a first head part horizontally extending on on the first dielectric layer, and a first tail part vertically penetrating the first dielectric layer and being exposed on a bottom surface of the first dielectric layer. The first head part of the under-bump pattern may have a first lateral surface on the first dielectric layer. The first lateral surface may be inclined relative to a top surface of the first dielectric layer. The second conductive pattern may have a second lateral surface on the second dielectric layer. The second lateral surface may be perpendicular to a top surface of the second dielectric layer.

According to an example embodiment of the present inventive concepts, a semiconductor package includes a package substrate, an interposer substrate on the package substrate, the interposer substrate electrically connected to the package substrate through a substrate terminal, a chip stack on the interposer substrate, the chip stack including a plurality of first semiconductor chips that are vertically stacked, and a second semiconductor chip on the interposer substrate, the second semiconductor chip horizontally spaced apart from the chip stack. The interposer substrate may include: a first dielectric layer, an under-bump pattern penetrating the first dielectric layer and exposed on a bottom surface of the first dielectric layer, the under-bump pattern protruding onto the first dielectric layer, a second dielectric layer on the first dielectric layer and covering the under-bump pattern, a conductive pattern on the second dielectric layer and electrically connected to the under-bump pattern, and a third dielectric layer on the second dielectric layer and covering the conductive pattern. The substrate terminal may be on a bottom surface of the under-bump pattern that is exposed on the bottom surface of the first dielectric layer. A head part of the under-bump pattern may horizontally extends on the first dielectric layer and may have a first lateral surface that is inclined relative to a top surface of the first dielectric layer. The conductive pattern may have a second lateral surface on the second dielectric layer and inclined relative to the first lateral surface. A top surface of the under-bump pattern may be parallel to the top surface of the first dielectric layer.

According to an example embodiment of the present inventive concepts, a method of fabricating a semiconductor package includes forming a first wiring layer including an under-bump pattern, forming a second wiring layer on the first wiring layer, forming a substrate pad on the second wiring layer, mounting a semiconductor chip on the substrate pad, and providing a connection terminal below the under-bump pattern. The forming the first wiring layer may include forming a first dielectric layer, patterning the first dielectric layer to define a first hole penetrating therethrough, forming a conductive layer to cover the first dielectric layer and to fill the first hole, forming a first mask pattern on the conductive layer, and forming the under-bump pattern by using the first mask pattern as an etching mask to etch the conductive layer. The forming the second wiring layer may include forming a second dielectric layer on the first dielectric layer to cover the under-bump pattern, patterning the second dielectric layer to define a second hole penetrating therethrough and to expose the under-bump pattern, forming a second mask pattern on the second dielectric layer, the second mask pattern having an exposure pattern that exposes the second hole, and forming a conductive pattern by filling the second hole and the exposure pattern with a conductive material. A lateral surface of the under-bump pattern on the first dielectric layer may be inclined relative to a top surface of the first dielectric layer. A lateral surface of the conductive pattern on the second dielectric layer, may be perpendicular to a top surface of the second dielectric layer.

DETAIL PARTED DESCRIPTION

The following will now describe a semiconductor package according to some example embodiments of the present inventive concepts with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
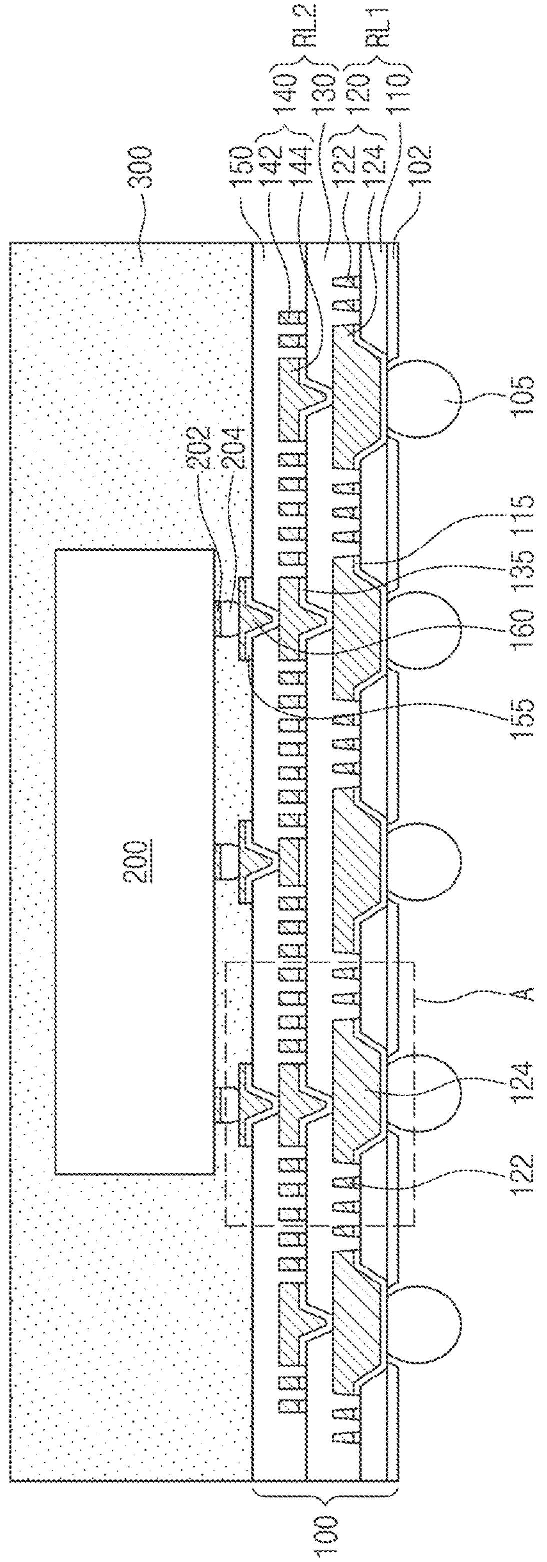
FIG. 1 illustrates a cross-sectional view showing a semiconductor package according to an example embodiment of the present inventive concepts.
Figure 2:
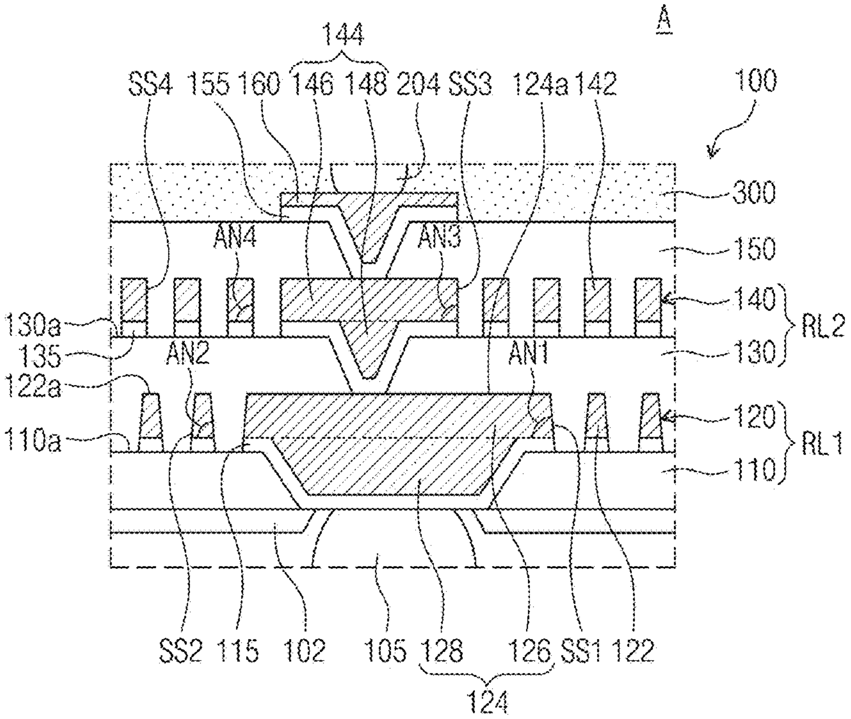
FIGS. 2 to 5 illustrate enlarged views showing section A of FIG. 1.
Figure 3:
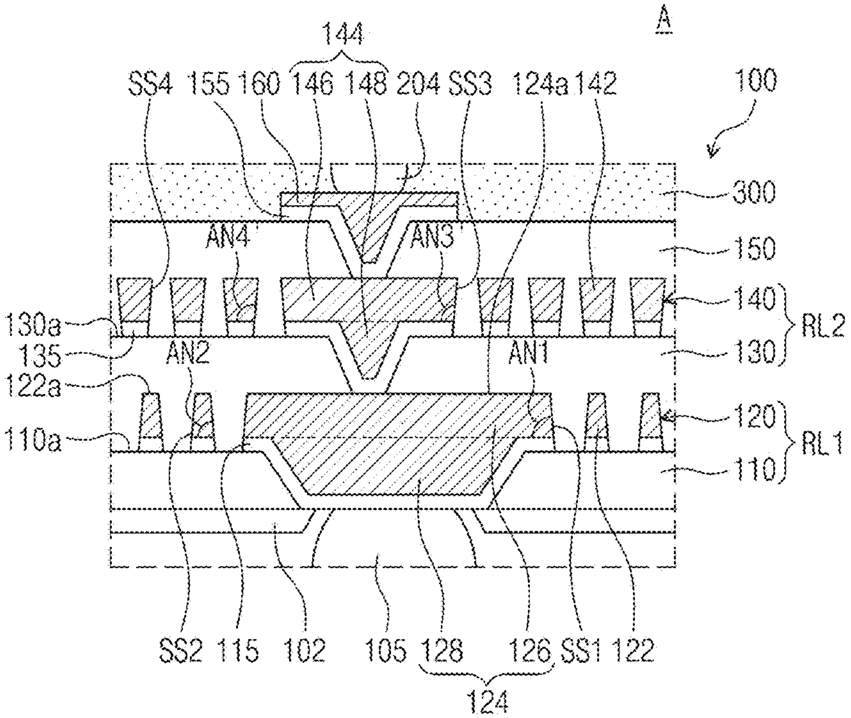

FIG. 1 illustrates a cross-sectional view showing a semiconductor package according to an example embodiment of the present inventive concepts. FIG. 2 illustrates an enlarged view showing section A of FIG. 1. FIG. 3 illustrates an enlarged view showing section A of FIG. 1.

Referring to FIGS. 1 and 2, a semiconductor package according to an example embodiment of the present inventive concepts may include a redistribution substrate 100, a semiconductor chip 200, and a molding layer 300.

The redistribution substrate 100 may be provided on a bottom surface of the semiconductor chip 200 and a bottom surface of the molding layer 300. The redistribution substrate 100 may have a thickness less than that of the semiconductor chip 200. The redistribution substrate 100 may include at least one wiring layer. The wiring layer may be provided in plural. In an example embodiment, the redistribution substrate 100 may include a protection layer 102 and at least two wiring layers RL1 and RL2.

A first wiring layer RL1 may be provided as a lowermost wiring layer of the redistribution substrate 100. The first wiring layer RL1 may be provided for various wirings connected to the semiconductor chip 200. The first wiring layer RL1 may include a first dielectric layer 110 and a first conductive pattern 120.

The first dielectric layer 110 may be provided. The first dielectric layer 110 may include a photo-imageable dielectric (PID). For example, the first dielectric layer 110 may include a photo-imageable polymer such as photosensitive polyimide (PI), polybenzoxazole (PBO), phenolic polymers, and benzocyclobutene polymers. In some example embodiments, the first dielectric layer 110 may include a dielectric material. For example, the first dielectric layer 110 may include silicon oxide (SiO), silicon nitride (SiN), silicon oxynitride (SiON), or dielectric polymers.

The first conductive pattern 120 may be provided on the first dielectric layer 110. The first conductive pattern 120 may horizontally extend on the first dielectric layer 110. The first conductive pattern 120 may include a conductive material. For example, the first conductive pattern 120 may include copper (Cu). The first conductive pattern 120 may include a first wiring pattern 122 and under-bump patterns 124 of the first wiring layer RL1.

The first wiring pattern 122 may be a component for horizontal redistribution in the first wiring layer RL1. For example, the first wiring pattern 122 may be provided on a top surface 110*a* of the first dielectric layer 110. The first wiring pattern 122 may horizontally extend on the first dielectric layer 110.

The under-bump patterns 124 may be lower substrate pads of the redistribution substrate 100 for coupling substrate terminals 105 to the lower substrate pads. For example, the under-bump patterns 124 may penetrate the first dielectric layer 110 to be exposed on a bottom surface of the first dielectric layer 110. In more detail part, the under-bump patterns 124 may each have a damascene structure. For example, each of the under-bump patterns 124 may have a first head part 126 and a first tail part 128 that are integrally connected into a single unitary piece. The first head part 126 and the first tail part 128 may have no interface therebetween. The first head part 126 connected to the first tail part 128 may have a width greater than that of the first tail part 128. For example, the first head part 126 and the first tail part 128 of the under-bump pattern 124 may have a T-shaped cross section.

The first head part 126 may be a pad portion to which a second conductive pattern 140 of a second wiring layer RL2 is coupled. The first head parts 126 of the under-bump patterns 124 may be disposed on and protrude onto the top surface 110*a* of the first dielectric layer 110.

The first tail parts 128 may be exposed on the bottom surface of the first dielectric layer 110, and may be lower substrate pads of the redistribution substrate 100 on which substrate terminals 105 are provided. The first tail parts 128 may have relatively large widths (or areas) for easy coupling with the substrate terminals 105. For example, the first tail part 128 may have a width (or area) greater than that of a second tail part 148 of a first connection pattern 144 which will be discussed below. The present inventive concepts, however, are not limited thereto, and the width and the area of the first tail part 128 may be variously changed as desired, and the first tail part 128 may have a planar shape that is variously changed as desired. The first tail part 128 of the under-bump pattern 124 may extend from a bottom surface of the first head part 126, and may penetrate the first dielectric layer 110 to be exposed on the bottom surface of the first dielectric layer 110.

The first wiring layer RL1 may further include a first seed/barrier layer 115 interposed between the first dielectric layer 110 and the first conductive pattern 120. The first seed/barrier layer 115 may conformally cover a bottom surface of the first conductive pattern 120. For example, the first seed/barrier layer 115 may be interposed between the top surface 110*a* of the first dielectric layer 110 and a bottom surface of the first wiring pattern 122. The first seed/barrier layer 115 may be interposed between the top surface 110*a* of the first dielectric layer 110 and the bottom surface of the first head part 126 of the under-bump pattern 124, and between the first dielectric layer 110 and a lateral surface of the first tail part 128 of the under-bump pattern 124. In this case, the first seed/barrier layer 115 may not cover any of a lateral surface of the first wiring pattern 122 and a lateral surface of the first head part 126 of the under-bump pattern 124. As the first tail part 128 of the under-bump pattern 124 penetrates the first dielectric layer 110, on the bottom surface of the first tail part 128 of the under-bump pattern 124, the first seed/barrier layer 115 may be exposed on the bottom surface of the first dielectric layer 110. The first seed/barrier layer 115 may include a metallic material, such as gold (Au), titanium (Ti), or tantalum (Ta). In some example embodiments, the first seed/barrier layer 115 may include mental nitride, such as titanium nitride (TiN) or tantalum nitride (TaN).

A second wiring layer RL2 may be disposed on the first wiring layer RL1. The second wiring layer RL2 may be provided for various wirings connected to the semiconductor chip 200. For example, the redistribution substrate 100 may use the first and second wiring layers RL1 and RL2 to redistribute the semiconductor chip 200. The first and second wiring layers RL1 and RL2 may be wiring layers for redistributing the same or different signals. For example, both of the first and second wiring layers RL1 and RL2 may be wiring layers for transferring data signals of the semiconductor chip 200. For example, one of the first and second wiring layers RL1 and RL2 may be provided to transfer data signals of the semiconductor chip 200, and the other of the first and second wiring layers RL1 and RL2 may be provided to transfer power and ground signals to the semiconductor chip 200. The second wiring layer RL2 may include a second dielectric layer 130 and a second conductive pattern 140.

The second dielectric layer 130 may be provided on the first dielectric layer 110. On the first dielectric layer 110, the second dielectric layer 130 may cover the first conductive pattern 120. For example, the first conductive pattern 120 may be covered or buried with the first dielectric layer 110 and the second dielectric layer 130. The second dielectric layer 130 may include the same material as that of the first dielectric layer 110. The second dielectric layer 130 may include a photo-imageable dielectric (PID). For example, the second dielectric layer 130 may include a photo-imageable polymer such as photosensitive polyimide (PI), polybenzoxazole (PBO), phenolic polymers, and benzocyclobutene polymers. In some example embodiments, the second dielectric layer 130 may include a dielectric material. For example, the second dielectric layer 130 may include silicon oxide (SiO), silicon nitride (SiN), silicon oxynitride (SiON), or dielectric polymers.

The second conductive pattern 140 may be provided on the second dielectric layer 130. The second conductive pattern 140 may horizontally extend on the second dielectric layer 130. The second conductive pattern 140 may include a conductive material. For example, the second conductive pattern 140 may include copper (Cu). The second conductive pattern 140 may include a second wiring pattern 142 and first connection patterns 144 of the second wiring layer RL2.

The second wiring pattern 142 may be a component for horizontal redistribution in the second wiring layer RL2. For example, the second wiring pattern 142 may be provided on a top surface 130*a* of the second dielectric layer 130. The second wiring pattern 142 may horizontally extend on the second dielectric layer 130.

The first connection patterns 144 may be a component for vertical connection between the second conductive pattern 140 of the second wiring layer RL2 and the first conductive pattern 120 of the first wiring layer RL1. For example, the first connection patterns 144 may penetrate the second dielectric layer 130 to be coupled to the first conductive pattern 120. In some example embodiments, the first connection patterns 144 may each have a damascene structure. For example, each of the first connection patterns 144 may have a second head part 146 and a second tail part 148 that are integrally connected into a single unitary piece. The second head part 146 and the second tail part 148 may have no interface therebetween. The second head part 146 connected to the second tail part 148 may have a width greater than that of the second tail part 148. For example, the second head part 146 and the second tail part 148 of the first connection pattern 144 may have a T-shaped cross section.

The second head part 146 may be a pad portion to which an upper substrate pad 160 of the redistribution substrate 100 is coupled. The second head part 146 of the first connection pattern 144 may be disposed on and protrude onto the top surface 130*a* of the second dielectric layer 130.

The second tail part 148 may be a via portion for vertical connection between the second conductive pattern 140 and the first conductive pattern 120. The second tail part 148 of the first connection pattern 144 may extend from a bottom surface of the second head part 146, and may penetrate the second dielectric layer 130 to be coupled to the first conductive pattern 120.

The second wiring layer RL2 may further include a second seed/barrier layer 135 interposed between the second dielectric layer 130 and the second conductive pattern 140. The second seed/barrier layer 135 may conformally cover a bottom surface of the second conductive pattern 140. For example, the second seed/barrier layer 135 may be interposed between the top surface 130*a* of the second dielectric layer 130 and a bottom surface of the second wiring pattern 142. For example, the second seed/barrier layer 135 may be interposed between the top surface 130*a* of the second dielectric layer 130 and the bottom surface of the second head part 146 of the first connection pattern 144 and between the second dielectric layer 130 and a lateral surface of the second tail part 148 of the first connection pattern 144. In this case, the second seed/barrier layer 135 may not cover a lateral surface of the second wiring pattern 142 nor a lateral surface of the second head part 146 of the first connection pattern 144. As the second tail part 148 of the first connection pattern 144 contacts the first conductive pattern 120, on the bottom surface of the second tail part 148 of the first connection pattern 144, the second seed/barrier layer 135 may be interposed between the second tail part 148 and the first conductive pattern 120. The second seed/barrier layer 135 may include a metallic material, such as gold (Au), titanium (Ti), or tantalum (Ta). In some example embodiments, the second seed/barrier layer 135 may include mental nitride, such as titanium nitride (TiN) or tantalum nitride (TaN).

The first conductive pattern 120 of the first wiring layer RL1 may have a shape different from that of the second conductive pattern 140 in the second wiring layer RL2. A configuration of the first and second wiring layers RL1 and RL2 will be further discussed in detail part with reference to FIG. 2.

Referring to FIG. 2, a first lateral surface SS1 of the under-bump pattern 124 of the first conductive pattern 120 may not be parallel to a third lateral surface SS3 of the first connection pattern 144 of the second conductive pattern 140. For example, the first lateral surface SS1 and the third lateral surface SS3 may be inclined relative to each other. The first lateral surface SS1 of the under-bump pattern 124 may be an outermost lateral surface of the under-bump pattern 124 positioned on the first dielectric layer 110, and may correspond to the lateral surface of the first head part 126 of the under-bump pattern 124. The third lateral surface SS3 of the first connection pattern 144 may be an outermost lateral surface of the first connection pattern 144 positioned on the second dielectric layer 130, and may correspond to the lateral surface of the second head part 146 of the first connection pattern 144.

The first lateral surface SS1 of the first head part 126 may be inclined relative to the top surface 110*a* of the first dielectric layer 110. For example, a first bottom surface of the first head part 126 may be substantially parallel to the top surface 110*a* of the first dielectric layer 110, and a first angle AN1 less than about 90° may be provided between the first lateral surface SS1 of the first head part 126 and the first bottom surface of the first head part 126. For example, there may be an acute angle or the first angle AN1 between the first lateral surface SS1 and the first bottom surface of the first head part 126. The first angle AN1 may range from about 45° to about 89°. In this case, the first head part 126 of the under-bump pattern 124 may have a width that decreases with increasing distance from the top surface 110*a* of the first dielectric layer 110. Further, a second angle AN2 less than about 90° may be provided between a second lateral surface SS2 of the first wiring pattern 122 in the first wiring layer RL1 and the bottom surface of the first wiring pattern 122 in the first wiring layer RL1. The bottom surface of the first wiring pattern 122 may be located at the same level as that of the first bottom surface of the first head part 126. The second angle AN2 may be the same as or substantially similar to the first angle AN1. For example, the second angle AN2 may range from about 45° to about 89°. The first wiring pattern 122 may have a width that decreases with increasing distance from the top surface 110*a* of the first dielectric layer 110.

The second head part 146 may have a second bottom surface substantially parallel to the top surface 130*a* of the second dielectric layer 130, and the third lateral surface SS3 of the second head part 146 may be disposed at a third angle AN3 perpendicular to the second bottom surface of the second head part 146. For example, there may be a right angle (90°) or the third angle AN3 between the second bottom surface and the third lateral surface SS3 of the second head part 146. The second head part 146 of the first connection pattern 144 may have a width that is uniform irrespective of a distance from the top surface 130*a* of the second dielectric layer 130. Further, a fourth lateral surface SS4 of the second wiring pattern 142 in the second wiring layer RL2 may be disposed at a fourth angle AN4 perpendicular to the bottom surface of the second wiring pattern 142. The fourth angle AN4 may be the same as or substantially similar to the third angle AN3. For example, the fourth angle AN4 may be about 90°. The second wiring pattern 142 may have a width that is uniform irrespective of a distance from the top surface 130*a* of the second dielectric layer 130.

The lateral surface of the first tail part 128 of the under-bump pattern 124 may be inclined relative to the top surface 110*a* of the first dielectric layer 110. For example, an angle between the lateral surface of the first tail part 128 of the under-bump pattern 124 and the top surface 110*a* of the first dielectric layer 110 may be about 45° to about 89°. The lateral surface of the second tail part 148 of the first connection pattern 144 may be inclined relative to the top surface 130*a* of the second dielectric layer 130. For example, an angle between the top surface 130*a* of the second dielectric layer 130 and the lateral surface of the second tail part 148 of the first connection pattern 144 may be about 45° to about 89°.

According to an example embodiment, as shown in FIG. 3, a third angle AN3' greater than about 90° may be provided between the third lateral surface SS3 and the second bottom surface of the second head part 146. For example, there may be an obtuse angle or the third angle AN3' between the second bottom surface and the third lateral surface SS3 of the second head part 146. The third angle AN3' may range from about 91° to about 135°. For example, the second head part 146 of the first connection pattern 144 may have a width that increases with increasing distance from the top surface 130*a* of the second dielectric layer 130. Further, the fourth lateral surface SS4 of the second wiring pattern 142 in the second wiring layer RL2 may be disposed at a fourth angle AN4' perpendicular to the bottom surface of the second wiring pattern 142 in the second wiring layer RL2. The fourth angle AN4' may be the same as or substantially similar to the third angle AN3'. For example, the fourth angle AN4' may range from about 91° to about 135°. The second wiring pattern 142 may have a width that increases with increasing distance from the top surface 130*a* of the second dielectric layer 130. The following description will focus on the example embodiment of FIG. 2.

Referring back to FIGS. 1 and 2, the under-bump pattern 124 may have a first top surface 124*a* that is not recessed toward the first dielectric layer 110. The first top surface 124*a* of the under-bump pattern 124 may be substantially parallel to the top surface 110*a* of the first dielectric layer 110. The under-bump pattern 124 may be flat at the first top surface 124*a* thereof. For example, the first head part 126 of the under-bump pattern 124 may have a thickness that is uniform irrespective of horizontal position. The first top surface 124*a* of the under-bump pattern 124 may be located at the same level as that of a second top surface 122*a* of the first wiring pattern 122, which is measured from the top surface 110*a* of the first dielectric layer 110. For example, the first top surface 124*a* of the under-bump pattern 124 may be positioned on the same plane on which the second top surface 122*a* of the first wiring pattern 122 is positioned.

The top surface 130*a* of the second dielectric layer 130 that covers the under-bump patterns 124 may not be recessed toward the first dielectric layer 110. The top surface 130*a* of the second dielectric layer 130 may be substantially parallel to the top surface 110*a* of the first dielectric layer 110. The second dielectric layer 130 may be flat at the top surface 130*a* thereof.

According to an example embodiment of the present inventive concepts, the first top surfaces 124*a* of the under-bump patterns 124 may not be recessed. Therefore, the under-bump patterns 124 may be provided to have the flat first top surfaces 124*a*, and in the wiring layer RL1, the under-bump patterns 124 and the first wiring pattern 122 may be provided on a horizontal plane and located at the same level. For example, the first wiring layer RL1 may have flat wiring lines (the under-bump patterns 124 and the first wiring pattern 122), and no undulation may occur on the first wiring layer RL1 including the under-bump patterns 124. In this description, the term "undulation" may mean a variation in flexibility (e.g., curvature of a surface) or thickness of a certain layer. As the first wiring layer RL1 is provided in a flat shape, in the second wiring layer RL2 provided on the first wiring layer RL1, the first connection patterns 144 and the second wiring pattern 142 may be provided on a horizontal plane and located at the same level. For example, in comparison with the first wiring layer RL1 and the second wiring layer RL2 each having undulation, the first wiring layer RL1 and the second wiring layer RL2 each being provided in a flat shape may be configured such that a uniform interval is provided between the first conductive pattern 120 and the second conductive pattern 140. A short-circuit may be generated when a small interval is provided between the first conductive pattern 120 and the second conductive pattern 140, but according to an example embodiment of the present inventive concepts, no short-circuit may occur between the first conductive pattern 120 and the second conductive pattern 140, and a semiconductor package may increase in electrical properties and drive reliability. An effect due to the shape of the first and second wiring layers RL1 and RL2 will be discussed in detail in explaining a method of fabricating a semiconductor package.

Further, according to an example embodiment of the present inventive concepts, the first wiring layer RL1 and the second wiring layer RL2 each having a flat shape may be robust to deformation caused by external force. In comparison with the first wiring layer RL1 and the second wiring layer RL2 each having undulation, the first wiring layer RL1 and the second wiring layer RL2 each having a flat shape may have relatively high durability to horizontal force. Thus, a semiconductor package may be provided to have increased structural stability.

Referring again to FIGS. 1 and 2, a third dielectric layer 150 may be provided on the second wiring layer RL2. On the second dielectric layer 130, the third dielectric layer 150 may cover the second conductive pattern 140. For example, the second conductive pattern 140 may be covered or buried with the second dielectric layer 130 and the third dielectric layer 150. The third dielectric layer 150 may include the same material as that of the first dielectric layer 110 and that of the second dielectric layer 130. The third dielectric layer 150 may include a photo-imageable dielectric (PID). For example, the third dielectric layer 150 may include a photo-imageable polymer such as photosensitive polyimide (PI), polybenzoxazole (PBO), phenolic polymers, and benzocyclobutene polymers. In some example embodiments, the third dielectric layer 150 may include a dielectric material. For example, the third dielectric layer 150 may include silicon oxide (SiO), silicon nitride (SiN), silicon oxynitride (SiON), or dielectric polymers.

The upper substrate pads 160 may be provided on the third dielectric layer 150. The upper substrate pads 160 may be pads of the redistribution substrate 100 on which the semiconductor chip 200 is mounted. The upper substrate pads 160 may be provided on a top surface of the third dielectric layer 150. A portion of each of the upper substrate pads 160 may penetrate the third dielectric layer 150 to be coupled to the second conductive pattern 140 of the second wiring layer RL2. The upper substrate pads 160 may include a conductive material. For example, the upper substrate pads 160 may include copper (Cu).

A third seed/barrier layer 155 may be interposed between the third dielectric layer 150 and the upper substrate pad 160. The third seed/barrier layer 155 may conformally cover a bottom surface of the upper substrate pad 160. For example, the third seed/barrier layer 155 may be interposed between the third dielectric layer 150 and the upper substrate pad 160 and between the second conductive pattern 140 and the upper substrate pad 160. The third seed/barrier layer 155 may include a metallic material, such as gold (Au), titanium (Ti), or tantalum (Ta). In some example embodiments, the third seed/barrier layer 155 may include mental nitride, such as titanium nitride (TiN) or tantalum nitride (TaN).

The protection layer 102 may be provided below the first wiring layer RL1. The protection layer 102 may cover a bottom surface of the first wiring layer RL1. The protection layer 102 may be a component for protecting a bottom surface of the redistribution substrate 100. The protection layer 102 may have recessed to a level corresponding to a bottom surface of the protection layer 102. The recesses may penetrate the protection layer 102 to expose the first dielectric layer 110. For example, the recesses may have bottom surfaces, levels of which correspond to the bottom surface of the first dielectric layer 110. In this case, the under-bump patterns 124 may be exposed by corresponding recesses. The recesses may be provided on areas where the substrate terminals 105 are provided. The protection layer 102 may include a dielectric material. For example, the protection layer 102 may include silicon oxide (SiO), silicon nitride (SiN), silicon oxynitride (SiON), or dielectric polymers.

The substrate terminals 105 may be disposed below the redistribution substrate 100. For example, the substrate terminals 105 may be disposed on the under-bump patterns 124 located on the bottom surface of the redistribution substrate 100. The substrate terminals 105 may be coupled to bottom surfaces of the under-bump patterns 124 in the recesses formed on the protection layer 102. The substrate terminals 105 may include solder balls or solder bumps, and based on type of the substrate terminals 105, a semiconductor package may be provided in the shape of one of a ball grid array (BGA) type, a fine ball-grid array (FBGA) type, and a land grid array (LGA) type.

The semiconductor chip 200 may be disposed on the redistribution substrate 100. The semiconductor chip 200 may include a semiconductor material, such as silicon (Si). The semiconductor chip 200 may be a transistor such as junction transistor or field effect transistor, a diode such as rectification diode, light emitting diode, or photodiode, a memory element, or an active element such as integrated circuit. In some example embodiments, the semiconductor chip 200 may be a passive element such as condenser, resistor, or coil. A bottom surface of the semiconductor chip 200 may be an active surface, and a top surface of the semiconductor chip 200 may be an inactive surface. For example, the semiconductor chip 200 may have chip pads 202 provided on the bottom surface of the semiconductor chip 200. The chip pads 202 may be electrically connected to an integrated circuit provided in the semiconductor chip 200. The semiconductor chip 200 may be provided with chip connection terminals 204 on the bottom surface thereof. The chip connection terminals 204 may be provided on the bottom surface of the chip pads 202, thereby being coupled to the chip pads 202.

The semiconductor chip 200 may be mounted on the redistribution substrate 100. For example, the semiconductor chip 200 may be coupled through the chip connection terminals 204 to the upper substrate pads 160 of the redistribution substrate 100. The chip connection terminals 204 may be provided between the chip pads 202 of the semiconductor chip 200 and the upper substrate pads 160 of the redistribution substrate 100.

Although not shown, an under-fill layer may be provided between the redistribution substrate 100 and the semiconductor chip 200. The under-fill layer may fill a space between the redistribution substrate 100 and the semiconductor chip 200 and may surround the chip connection terminals 204.

The molding layer 300 may be provided on the redistribution substrate 100. The molding layer 300 may cover a top surface of the redistribution substrate 100. The molding layer 300 may surround the semiconductor chip 200. The molding layer 300 may include a dielectric material. For example, the molding layer 300 may include an epoxy molding compound (EMC).

Figure 4:
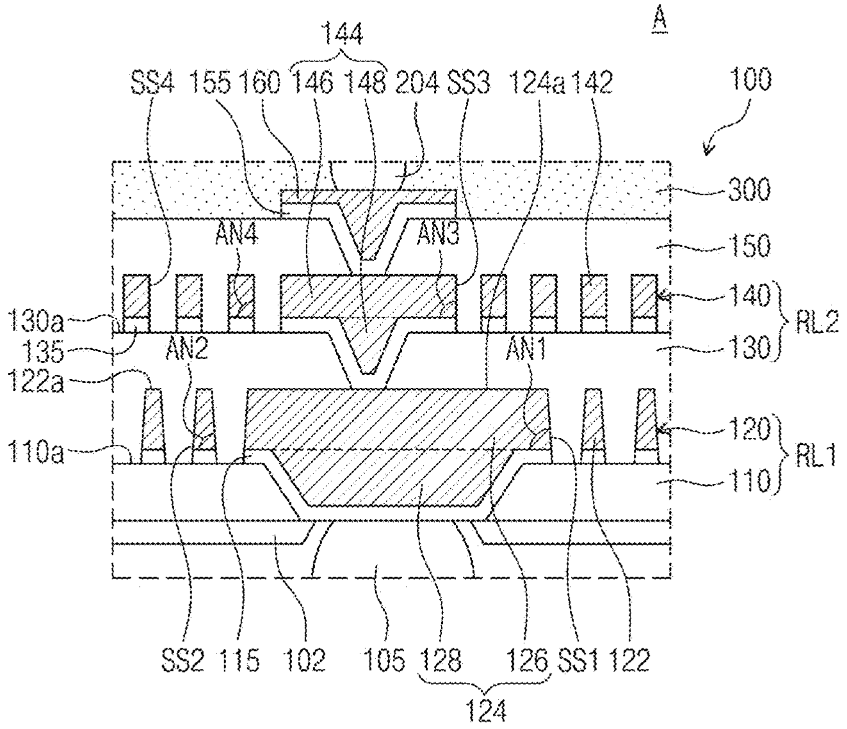

FIG. 2 depicts that the first wiring layer RL1 and the second wiring layer RL2 have the same or similar thicknesses, but the present inventive concepts are not limited thereto. FIG. 4 illustrates an enlarged view showing section A of FIG. 1. In the example embodiments that follow, components the same as those discussed with reference to FIGS. 1 to 3 are allocated the same reference numerals thereto, and a repetitive explanation thereof will be omitted or abridged for convenience of description. The following description will focus on differences between the embodiments of FIGS. 1 to 3 and other embodiments described below.

As shown in FIG. 4, the first wiring layer RL1 may have a thickness greater than that of the second wiring layer RL2. For example, a thickness of the first conductive pattern 120 in the first wiring layer RL1 may have a thickness greater than that of the second conductive pattern 140 in the second wiring layer RL2. A thickness of each of the first head part 126 and the first wiring pattern 122 of the under-bump pattern 124 positioned on the first dielectric layer 110 may be greater than a thickness of each of the second head part 146 and the second wiring pattern 142 of the first connection pattern 144 positioned on the second dielectric layer 130.

According to an example embodiment of the present inventive concepts, when the first conductive pattern 120 of the first wiring layer RL1 has a relatively large thickness, the occurrence of undulation may be suppressed in the first wiring layer RL1. A semiconductor package according to an example embodiment of the present inventive concepts may have no short-circuit between the first conductive pattern 120 and the second conductive pattern 140, and may increase in electrical properties and drive reliability. Further, a pressure may be directly applied through the substrate terminals 105 to the under-bump patterns 124 when mounting the substrate terminals 105 and a semiconductor package. Therefore, the under-bump patterns 124 having relatively large thicknesses may be robust to external force, and a semiconductor package may increase in structural stability.

Figure 5:
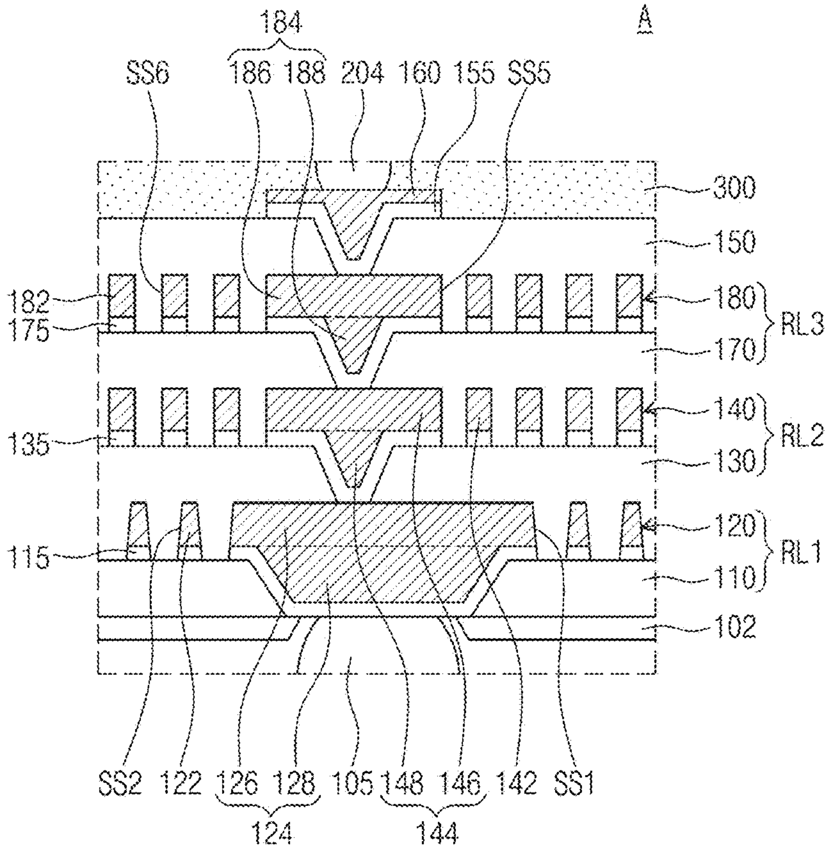

FIG. 2 depicts that the redistribution substrate 100 has two wiring layers RL1 and RL2, but the present inventive concepts are not limited thereto. FIG. 5 illustrates an enlarged view showing section A of FIG. 1 according to another example embodiment.

Referring to FIG. 5, a third wiring layer RL3 may be disposed on the second wiring layer RL2. The third wiring layer RL3 may be provided for various wirings connected to the semiconductor chip 200. For example, the redistribution substrate 100 may use the first, second, and third wiring layers RL1, RL2, and RL3 to redistribute the semiconductor chip 200. The third wiring layer RL3 may have a configuration the same as or substantially similar to that of the second wiring layer RL2. For example, the third wiring layer RL3 may include a fourth dielectric layer 170 and a third conductive pattern 180.

The fourth dielectric layer 170 may be provided on the second dielectric layer 130. On the second dielectric layer 130, the fourth dielectric layer 170 may cover the second conductive pattern 140. For example, the second conductive pattern 140 may be covered or buried with the second dielectric layer 130 and the fourth dielectric layer 170. The fourth dielectric layer 170 may include the same material as that of the first dielectric layer 110 and that of the second dielectric layer 130. The fourth dielectric layer 170 may include a photo-imageable dielectric (PID). For example, the fourth dielectric layer 170 may include a photo-imageable polymer such as photosensitive polyimide (PI), polybenzoxazole (PBO), phenolic polymers, and benzocyclobutene polymers. In some example embodiments, the fourth dielectric layer 170 may include a dielectric material. For example, the fourth dielectric layer 170 may include silicon oxide (SiO), silicon nitride (SiN), silicon oxynitride (SiON), or dielectric polymers.

The third conductive pattern 180 may be provided on the fourth dielectric layer 170. The third conductive pattern 180 may horizontally extend on the fourth dielectric layer 170. The third conductive pattern 180 may include a conductive material. For example, the third conductive pattern 180 may include copper (Cu). The third conductive pattern 180 may include a third wiring pattern 182 and second connection patterns 184 of the third wiring layer RL3.

The third wiring pattern 182 may be a component for horizontal redistribution in the third wiring layer RL3. For example, the third wiring pattern 182 may be provided on a top surface of the fourth dielectric layer 170. The third wiring pattern 182 may horizontally extend on the fourth dielectric layer 170.

The second connection patterns 184 may be components for vertical connection between the third conductive pattern 180 of the third wiring layer RL3 and the second conductive pattern 140 of the second wiring layer RL2. For example, the second connection patterns 184 may penetrate the fourth dielectric layer 170 to be coupled to the second conductive pattern 140. In some example embodiments, the second connection patterns 184 may each have a damascene structure. For example, the second connection pattern 184 may have a third head part 186 and a third tail part 188 that are integrally connected into a single unitary piece. The third head part 186 and the third tail part 188 of the second connection pattern 184 may have a T-shaped cross section.

The third head part 186 may be a pad portion to which the upper substrate pad 160 of the redistribution substrate 100 is coupled. The third head part 186 of the second connection pattern 184 may be disposed on the top surface of the fourth dielectric layer 170.

The third tail part 188 may be a via portion for vertical connection between the third conductive pattern 180 and the second conductive pattern 140. The third tail part 188 of the second connection pattern 184 may extend from a bottom surface of the third head part 186, and may penetrate the fourth dielectric layer 170 to be coupled to the second conductive pattern 140.

The third wiring layer RL3 may further include a fourth seed/barrier layer 175 interposed between the fourth dielectric layer 170 and the third conductive pattern 180. The fourth seed/barrier layer 175 may conformally cover a bottom surface of the third conductive pattern 180.

A first lateral surface SS1 of the under-bump pattern 124 of the first conductive pattern 120 may not be parallel to a fifth lateral surface SS5 of the second connection pattern 184 of the third conductive pattern 180. For example, the first lateral surface SS1 and the fifth lateral surface SS5 may be inclined relative to each other. The fifth lateral surface SS5 of the second connection pattern 184 may be an outermost lateral surface of the second connection pattern 184 positioned on the fourth dielectric layer 170, and may correspond to a lateral surface of the third head part 186 of the second connection pattern 184.

The first lateral surface SS1 of the first head part 126 may be inclined relative to the top surface of the first dielectric layer 110. For example, a first angle less than about 90° may be provided between the first lateral surface of the first head part 126 and the first bottom surface of the first head part 126.

The third head part 186 may have a third bottom surface substantially parallel to the top surface of the fourth dielectric layer 170, and the fifth lateral surface SS5 of the third head part 186 may be perpendicular to the third bottom surface of the third head part 186. For example, there may be a right angle (90°) between the third bottom surface and the fifth lateral surface SS5 of the third head part 186. The third head part 186 of the second connection pattern 184 may have a width that is uniform irrespective of a distance from the top surface of the fourth dielectric layer 170. Further, a sixth lateral surface SS6 of the third wiring pattern 182 in the third wiring layer RL3 may be perpendicular to a bottom surface of the third wiring pattern 182. For example, the third wiring pattern 182 may have a width that is uniform irrespective of a distance from the top surface of the fourth dielectric layer 170.

The third dielectric layer 150 may be provided on the third wiring layer RL3. On the fourth dielectric layer 170, the third dielectric layer 150 may cover the third conductive pattern 180. For example, the third conductive pattern 180 may be covered or buried with the fourth dielectric layer 170 and the third dielectric layer 150.

The upper substrate pads 160 may be provided on the third dielectric layer 150. The upper substrate pads 160 may be pads of the redistribution substrate 100 on which the semiconductor chip 200 is mounted. The upper substrate pads 160 may be provided on the top surface of the third dielectric layer 150. Each of the upper substrate pads 160 may penetrate the third dielectric layer 150 to be coupled to the third conductive pattern 180 of the third wiring layer RL3.

Figure 6:
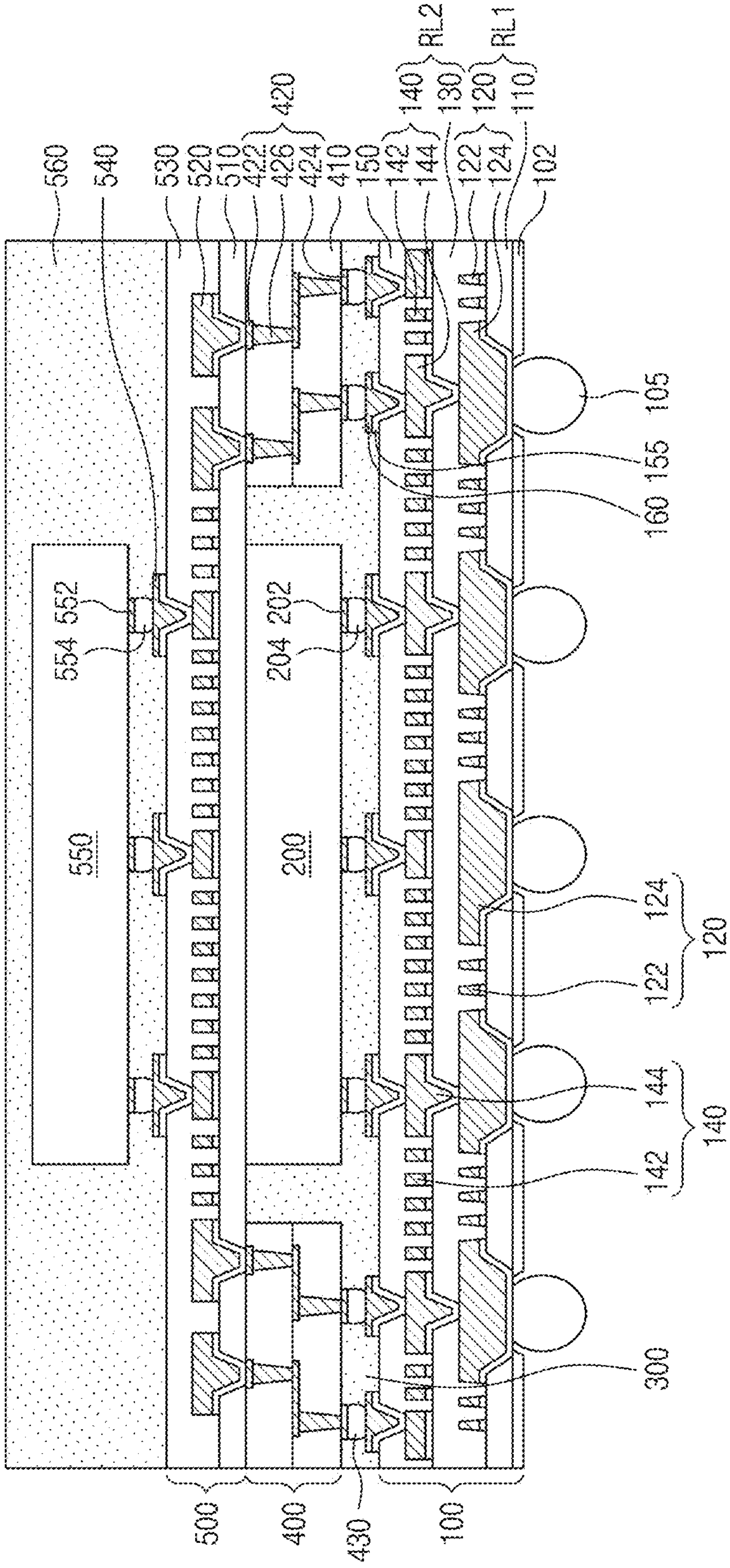
FIGS. 6 to 8 illustrate cross-sectional views showing a semiconductor package according to some example embodiments of the present inventive concepts.
Figure 7:
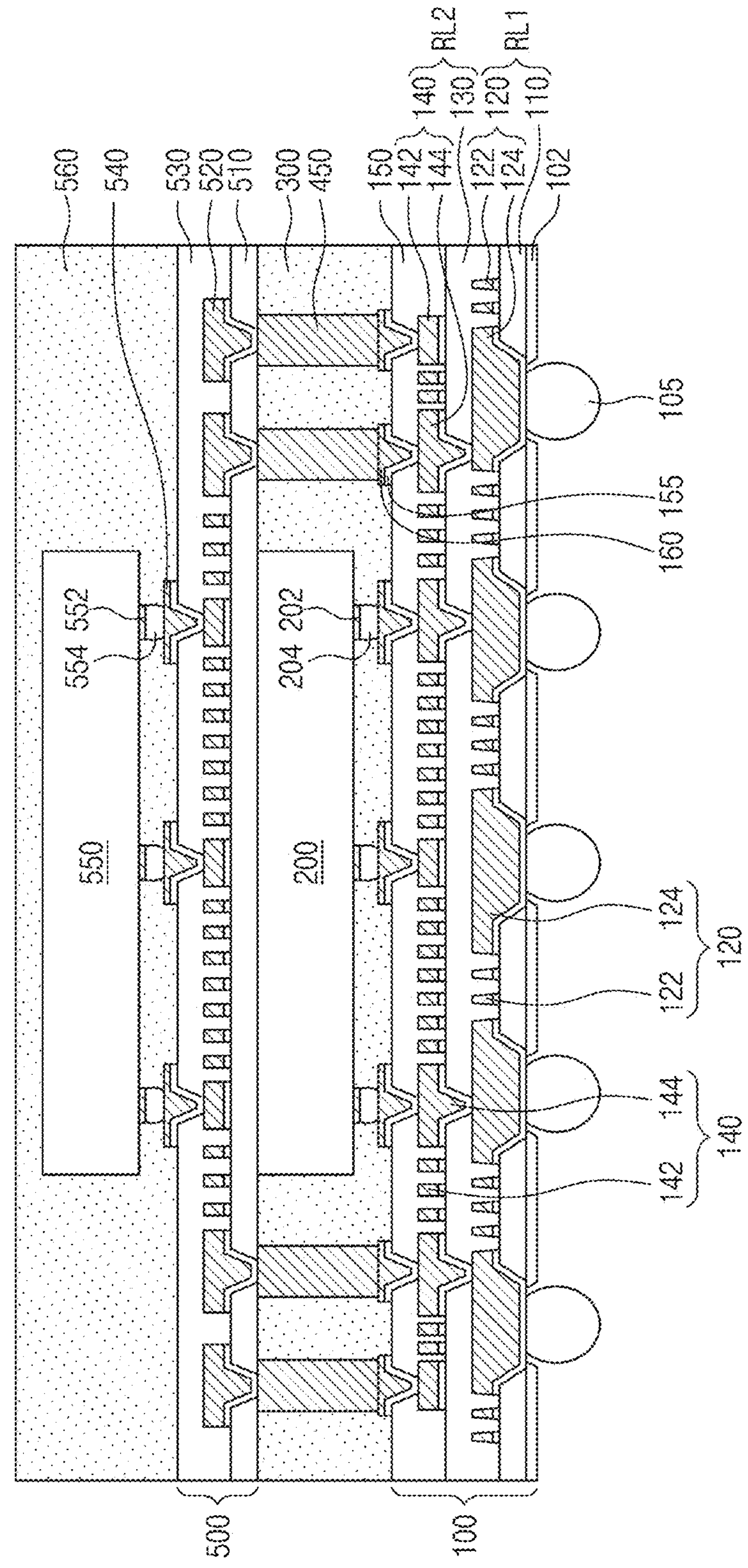

FIGS. 6 and 7 illustrate cross-sectional views showing a semiconductor package according to some example embodiments of the present inventive concepts.

Referring to FIG. 6, a lower substrate 100 may be provided. The lower substrate 100 may correspond to the redistribution substrate 100 discussed with reference to FIGS. 1 to 5.

A connection substrate 400 may be provided on the lower substrate 100. The connection substrate 400 may have an opening that penetrates therethrough. For example, the opening may be shaped like an open hole that connects top and bottom surfaces of the connection substrate 400 (in other words, that extends from the top surface of the connection substrate 400 to the bottom surface of the connection substrate 400). The bottom surface of the connection substrate 400 may be in contact with a top surface of the lower substrate 100. The connection substrate 400 may include a substrate base layer 410 and a conductive part 420 that is a wiring pattern provided in the substrate base layer 410. For example, the substrate base layer 410 may include silicon oxide (SiO). The conductive part 420 may be disposed at an outer portion of the connection substrate 400 rather than the opening. The conductive part 420 may include connection substrate upper pads 422, connection substrate lower pads 424, and connection substrate vias 426. The connection substrate upper pads 422 may be disposed on an upper portion of the connection substrate 400. The connection substrate lower pads 424 may be disposed on the bottom surface of the connection substrate 400. The connection substrate vias 426 may penetrate the substrate base layer 410, and may electrically connect the connection substrate upper pads 422 to the connection substrate lower pads 424.

The connection substrate 400 may be mounted on the lower substrate 100. For example, connection substrate terminals 430 may be provided on the connection substrate lower pads 424. The connection substrate 400 may be coupled through the connection substrate terminals 430 to the upper substrate pads 160 of the lower substrate 100. Therefore, the connection substrate 400 may be electrically connected to the semiconductor chip 200 and the substrate terminals 105.

A lower semiconductor chip 200 may be disposed on the lower substrate 100. The lower semiconductor chip 200 may correspond to the semiconductor chip 200 discussed with reference to FIGS. 1 to 5. The lower semiconductor chip 200 may be disposed in the opening of the connection substrate 400.

The lower substrate 100 may be provided thereon with a lower molding layer 300 that fills a space between the connection substrate 400 and the lower semiconductor chip 200. The lower molding layer 300 may surround the lower semiconductor chip 200 in the opening and may expose a top surface of the lower semiconductor chip 200. The lower molding layer 300 may expose the top surface of the connection substrate 400.

A redistribution layer 500 may be provided on the connection substrate 400. The redistribution layer 500 may be in contact with the top surface of the lower semiconductor chip 200 and with the top surface of the connection substrate 400. The redistribution layer 500 may include one or more substrate wiring layers that are stacked on each other. The substrate wiring layer may include a fifth dielectric layer 510 and a fourth conductive pattern 520. When the substrate wiring layer is provided in plural, the fourth conductive pattern 520 of one substrate wiring layer may be electrically connected to another fourth conductive pattern 520 of another substrate wiring layer adjacent to (e.g., vertically adjacent to) the one substrate wiring layer. The fourth conductive pattern 520 of a lowermost substrate wiring layer may penetrate the fifth dielectric layer 510 to be coupled to the connection substrate upper pads 422 of the connection substrate 400.

The fifth dielectric layer 510 may include a dielectric polymer or a photo-imageable dielectric (PID). For example, the photo-imageable dielectric may include at least one selected from photosensitive polyimide (PI), polybenzoxazole (PBO), phenolic polymers, and benzocyclobutene polymers.

The fourth conductive patterns 520 may be provided in the fifth dielectric layer 510. The fourth conductive pattern 520 may have a damascene structure. The fourth conductive pattern 520 may have, for example, a head part and a tail part that are integrally connected into a single unitary piece. The head part may be a wiring or pad portion that horizontally expands a wiring line in the redistribution layer 500. The tail part may be a via portion that vertically connect a wiring line in the redistribution layer 500. The fourth conductive pattern 520 may have a T-shaped cross section. The head part of the fourth conductive pattern 520 may be positioned on a top surface of the fifth dielectric layer 510. The tail part of the fourth conductive pattern 520 may have a bottom surface that is exposed on a bottom surface of the fifth dielectric layer 510. A seed/barrier layer may be interposed between the fifth dielectric layer 510 and the fourth conductive pattern 520.

A sixth dielectric layer 530 may be provided on an uppermost substrate wiring layer. On the fifth dielectric layer 510, the sixth dielectric layer 530 may cover the fourth conductive pattern 520. For example, the fourth conductive pattern 520 may be covered or buried with the fifth dielectric layer 510 and the sixth dielectric layer 530. The sixth dielectric layer 530 may include a dielectric polymer or a photo-imageable dielectric (PID).

The sixth dielectric layer 530 may be provided thereon with redistribution pads 540. The redistribution pads 540 may be pads of the redistribution layer 500 on which an upper semiconductor chip 550 is mounted. The redistribution pads 540 may be provided on a top surface of the sixth dielectric layer 530. A portion of each of the redistribution pads 540 may penetrate the sixth dielectric layer 530 to be coupled to the fourth conductive pattern 520. A seed/barrier layer may be interposed between the sixth dielectric layer 530 and each of the redistribution pads 540.

An upper semiconductor chip 550 may be disposed on the redistribution layer 500. The upper semiconductor chip 550 may be an active element or a passive element. A bottom surface of the upper semiconductor chip 550 may be an active surface, and a top surface of the upper semiconductor chip 550 may be an inactive surface. For example, the upper semiconductor chip 550 may have upper chip pads 552 provided on the bottom surface of the upper semiconductor chip 550. The upper chip pads 552 may be electrically connected to an integrated circuit in the upper semiconductor chip 550. The upper semiconductor chip 550 may be provided with upper chip connection terminals 554 on the bottom surface of the upper semiconductor chip 550. The upper chip connection terminals 554 may be provided on bottom surfaces of the upper chip pads 552, thereby being coupled to the upper chip pads 552.

The upper semiconductor chip 550 may be mounted on the redistribution layer 500. For example, the upper semiconductor chip 550 may be coupled through the upper chip connection terminals 554 to the redistribution pads 540 of the redistribution layer 500. The upper chip connection terminals 554 may be provided between the redistribution pads 540 of the redistribution layer 500 and the upper chip pads 552 of the upper semiconductor chip 550.

An upper molding layer 560 may be provided on the redistribution layer 500. The upper molding layer 560 may cover a top surface of the redistribution layer 500. The upper molding layer 560 may surround the upper semiconductor chip 550. The upper molding layer 560 may include a dielectric material. For example, the upper molding layer 560 may include an epoxy molding compound (EMC).

FIG. 6 depicts that the connection substrate 400 is used to connect the lower substrate 100 to the redistribution layer 500, but the present inventive concepts are not limited thereto.

Referring to FIG. 7, the lower semiconductor chip 200 may be mounted on the lower substrate 100. The lower substrate 100, the lower molding layer 300 may cover the lower semiconductor chip 200. The redistribution layer 500 may be provided on the lower molding layer 300. For example, in the example embodiment of FIG. 7, the lower molding layer 300 may fill a space between the lower substrate 100 and the redistribution layer 500.

One or more through electrodes 450 may be provided on the lower substrate 100. The through electrodes 450 may be disposed on one side of the lower semiconductor chip 200. The through electrodes 450 may vertically penetrate the lower molding layer 300. The through electrodes 450 may have one ends that extend toward the lower substrate 100 to be coupled to the upper substrate pads 160 of the lower substrate 100. The through electrodes 450 may have other ends that are exposed on a top surface of the lower molding layer 300. The top surfaces of through electrodes 450 may be coplanar with that of the lower molding layer 300. The through electrodes 450 each may have circular or polygonal pillar shapes that vertically penetrate the lower molding layer 300. The through electrodes 450 may be vertical connection terminals for electrically connecting the lower substrate 100 to the redistribution layer 500. The through electrodes 450 may include metal. For example, the through electrodes 450 may include copper (Cu).

Figure 8:
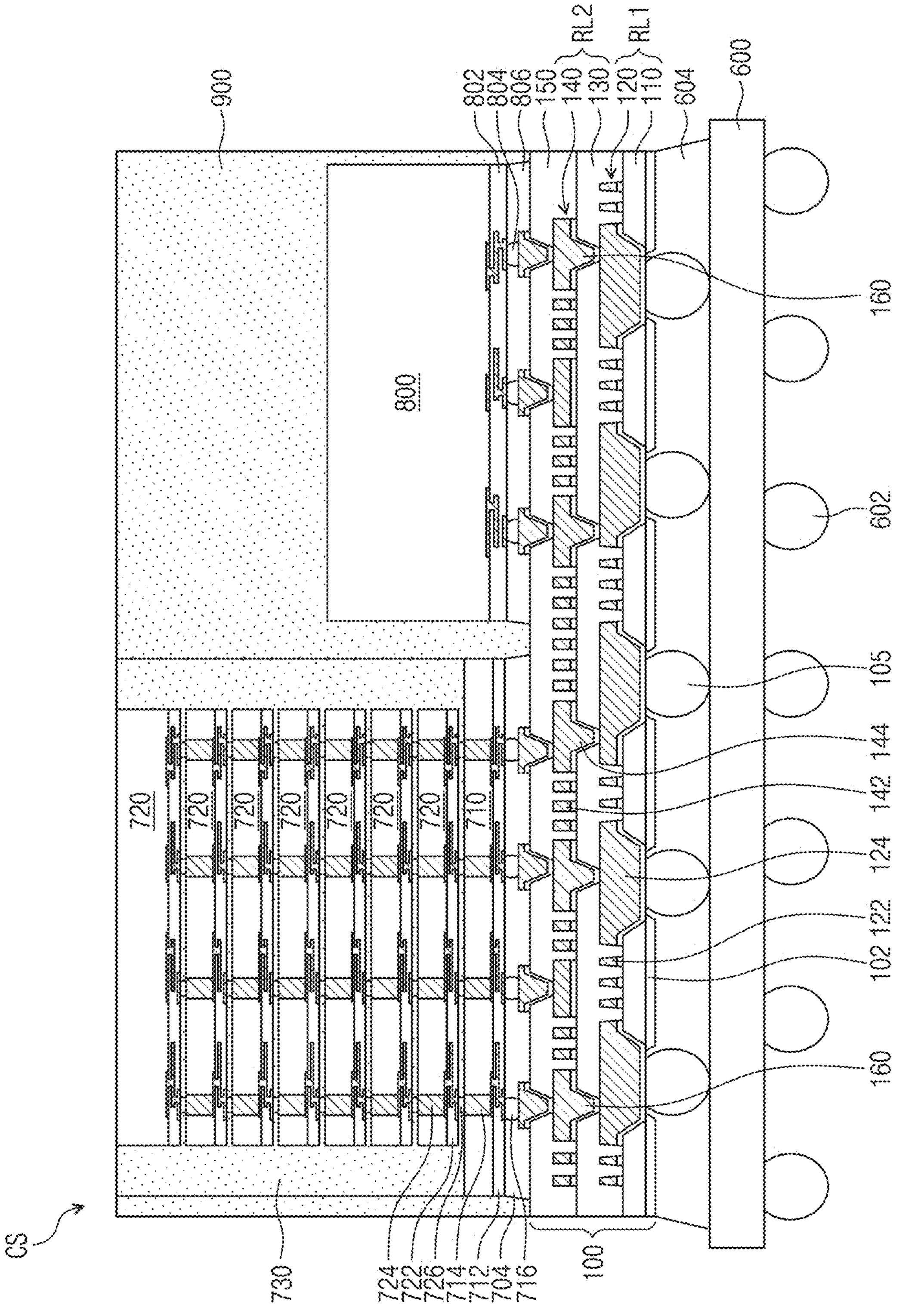

FIG. 8 illustrates a cross-sectional view showing a semiconductor package according to an example embodiment of the present inventive concepts.

Referring to FIG. 8, a package substrate 600 may be provided. The package substrate 600 may include a printed circuit board (PCB) having a signal pattern on a top surface thereof. In some example embodiments, the package substrate 600 may have a structure in which at least one dielectric layer and at least one wiring layer are alternately stacked. The package substrate 600 may have pads (not shown) disposed on a top surface thereof.

A plurality of external terminals 602 may be disposed below the package substrate 600. For example, the external terminals 602 may be disposed on terminal pads (not shown) provided on the bottom surface of the package substrate 600. The external terminals 602 may include solder balls or solder bumps, and based on type of the external terminals 602, a semiconductor package may be provided in the shape of one of a ball grid array (BGA) type, a fine ball-grid array (FBGA) type, and a land grid array (LGA) type.

An interposer substrate 100 may be provided on the package substrate 600. The interposer substrate 100 may correspond to the redistribution substrate 100 discussed with reference to FIGS. 1 to 5.

The interposer substrate 100 may be mounted on the top surface of the package substrate 600. The interposer substrate 100 may be provided thereon with substrate terminals 105 on a bottom surface thereof. The substrate terminals 105 may be provided between the pads of the package substrate 600 and the under-bump patterns 124 of the interposer substrate 100. The substrate terminals 105 may electrically connect the interposer substrate 100 to the package substrate 600. For example, the interposer substrate 100 may be flip-chip mounted on the package substrate 600. The substrate terminals 105 may include solder balls or solder bumps.

A first under-fill layer 604 may be provided between the package substrate 600 and the interposer substrate 100. The first under-fill layer 604 may surround the substrate terminals 105, while filling a space between the package substrate 600 and the interposer substrate 100.

A chip stack CS may be disposed on the interposer substrate 100. The chip stack CS may include a base substrate, first semiconductor chips 720 stacked on the base substrate, and a first molding layer 730 that surrounds the first semiconductor chips 720. The following will describe in detail a configuration of the chip stack CS.

The base substrate may be a base semiconductor chip 710. For example, the base substrate may be a wafer-level semiconductor substrate formed of a semiconductor material such as silicon (Si). In this description below, the base semiconductor chip 710 and the base substrate may indicate the same component and may be allocated with the same reference numeral.

The base semiconductor chip 710 may include a base circuit layer 712 and base through electrodes 714. The base circuit layer 712 may be provided on a bottom surface of the base semiconductor chip 710. The base circuit layer 712 may include an integrated circuit. For example, the base circuit layer 712 may be a memory circuit. For example, the base semiconductor chip 710 may be a memory chip, such as dynamic random access memory (DRAM), static random access memory (SRAM), magnetic random access memory (MRAM), or Flash memory. The base through electrode 714 may penetrate the base semiconductor chip 710 in a direction perpendicular to a top surface of the interposer substrate 100. The base through electrodes 714 may be electrically connected to the base circuit layer 712. The bottom surface of the base semiconductor chip 710 may be an active surface. According to an example embodiment, the base substrate may be a wiring substrate that does not include the base semiconductor chip 710.

The base semiconductor chip 710 may further include a protection layer (not shown) and first connection terminals 716. The protection layer may be disposed on the bottom surface of the base semiconductor chip 710, thereby covering the base circuit layer 712. The protection layer may include silicon nitride (SiN). The first connection terminals 716 may be provided on the bottom surface of the base semiconductor chip 710. The first connection terminals 716 may be electrically connected to an integrated circuit of the base circuit layer 712. The first connection terminals 716 may be exposed from the protection layer.

The first semiconductor chip 720 may be mounted on the base semiconductor chip 710. For example, the first semiconductor chip 720 and the base semiconductor chip 710 may constitute a chip-on-wafer (COW) structure. The first semiconductor chip 720 may have a width less than that of the base semiconductor chip 710.

The first semiconductor chip 720 may include a first circuit layer 722 and first through electrodes 724. The first circuit layer 722 may include a memory circuit. The first semiconductor chip 720 may be a memory chip, such as dynamic random access memory (DRAM), static random access memory (SRAM), magnetic random access memory (MRAM), or Flash memory. The first circuit layer 722 may include the same circuit as that of the base circuit layer 712, but the present inventive concepts are not limited thereto. The first through electrodes 724 may penetrate the first semiconductor chip 720 in a direction perpendicular to the top surface of the interposer substrate 100. The first through electrodes 724 may be electrically connected to the first circuit layer 722. A bottom surface of the first semiconductor chip 720 may be an active surface of the first semiconductor chip 720. The first semiconductor chip 720 may be provided with first chip bumps 726 on the bottom surface thereof. The first chip bumps 726 may intervene between and electrically connect the base semiconductor chip 710 and the first semiconductor chip 720.

The first semiconductor chip 720 may be provided in plural. For example, a plurality of first semiconductor chips 720 may be stacked on the base semiconductor chip 710. The number of stacked first semiconductor chips 720 may be about 8 to 32. The first chip bumps 726 may be provided between the first semiconductor chips 720. In this case, an uppermost first semiconductor chip 720 may not include the first through electrodes 724. In some example embodiments, the uppermost first semiconductor chip 720 may have a thickness greater than those of other first semiconductor chips 720 that underlie the uppermost first semiconductor chip 720.

Although not shown, an adhesion layer may be provided between the first semiconductor chips 720. The adhesion layer may include a non-conductive film (NCF). The adhesion layer may be interposed between the first chip bumps 726 between the first semiconductor chips 720, thereby mitigating or preventing the occurrence of electrical short between the first chip bumps 726.

A first molding layer 730 may be disposed on a top surface of the base semiconductor chip 710. The first molding layer 730 may cover the base semiconductor chip 710 and may surround the first semiconductor chips 720. The first molding layer 730 may have a top surface coplanar with that of the uppermost first semiconductor chip 720, and the uppermost first semiconductor chip 720 may be exposed from the first molding layer 730. The first molding layer 730 may include a dielectric polymer material. For example, the first molding layer 730 may include an epoxy molding compound (EMC).

The chip stack CS may thus be provided. The chip stack S may be mounted on the interposer substrate 100. For example, the chip stack CS may be coupled through the first connection terminals 716 of the base semiconductor chip 710 to the upper substrate pads 160 of the interposer substrate 100. The first connection terminals 716 may be provided between the upper substrate pads 160 of the interposer substrate 100 and the base circuit layer 712 of the base semiconductor chip 710.

A second under-fill layer 704 may be provided between the interposer substrate 100 and the chip stack CS. The second under-fill layer 704 may surround the first connection terminals 716, while filling a space between the interposer substrate 100 and the base semiconductor chip 710.

A second semiconductor chip 800 may be disposed on the interposer substrate 100. The second semiconductor chip 800 may be spaced apart from the chip stack CS. The second semiconductor chip 800 may have a thickness greater than those of the first semiconductor chips 720. The second semiconductor chip 800 may include a semiconductor material, such as silicon (Si). The second semiconductor chip 800 may include a second circuit layer 802. The second circuit layer 802 may include a logic circuit. For example, the second semiconductor chip 800 may be a logic chip. A bottom surface of the second semiconductor chip 800 may be an active surface, and a top surface of the second semiconductor chip 800 may be an inactive surface. The second semiconductor chip 800 may be provided with second connection terminals 804 on the bottom surface thereof. The second connection terminals 804 may be electrically connected to an integrated circuit of the second circuit layer 802.

The second semiconductor chip 800 may be mounted on the interposer substrate 100. For example, the second semiconductor chip 800 may be coupled through the second connection terminals 804 to the upper substrate pads 160 of the interposer substrate 100. The second connection terminals 804 may be provided between the upper substrate pads 160 of the interposer substrate 100 and the second circuit layer 802 of the second semiconductor chip 800.

A third under-fill layer 806 may be provided between the interposer substrate 100 and the second semiconductor chip 800. The third under-fill layer 806 may surround the second connection terminals 804, while filling a space between the interposer substrate 100 and the second semiconductor chip 800.

A second molding layer 900 may be provided on the interposer substrate 100. The second molding layer 900 may cover the top surface of the interposer substrate 100. The second molding layer 900 may surround the chip stack CS and the second semiconductor chip 800. The second molding layer 900 may include a dielectric material. For example, the second molding layer 900 may include an epoxy molding compound (EMC).

FIGS. 9 to 21 illustrate cross-sectional views showing a method of fabricating a semiconductor package according to an example embodiment of the present inventive concepts.

Figure 9:
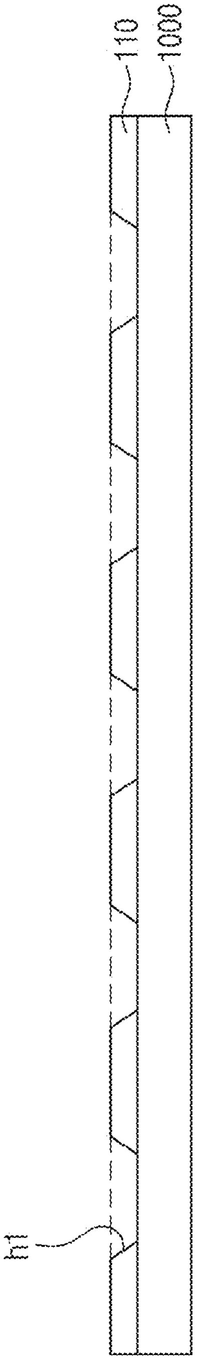
FIGS. 9 to 21 illustrate cross-sectional views showing a method of fabricating a semiconductor package according to an example embodiment of the present inventive concepts.

Referring to FIG. 9, a carrier substrate 1000 may be provided. The carrier substrate 1000 may be a dielectric substrate including glass or polymer, or may be a conductive substrate including metal. The carrier substrate 1000 may be provided with an adhesive member (not shown) on a top surface of the carrier substrate 1000. For example, the adhesive member may include a glue tape.

A first dielectric layer 110 may be formed on the carrier substrate 1000. The first dielectric layer 110 may be formed by coating and curing a dielectric material on the carrier substrate 1000. The first dielectric layer 110 may cover the top surface of the carrier substrate 1000. The dielectric material may include a photo-imageable dielectric (PID).

The first dielectric layer 110 may be patterned to form first holes h1. The first holes h1 may expose the top surface of the carrier substrate 1000. The first holes h1 may define areas where first tail parts (see 128 of FIG. 11) of under-bump patterns (see 124 of FIG. 11) will be formed in a subsequent process, which will be discussed below. As the first holes h1 define areas where first tail parts 128 of under-bump patterns 124, to which external terminals are coupled, are to be formed, the first holes h1 may be formed to have relatively large widths. For example, the widths of the first holes h1 may be greater than those of second holes (see h2 of FIG. 13) discussed in a subsequent process.

Figure 10:
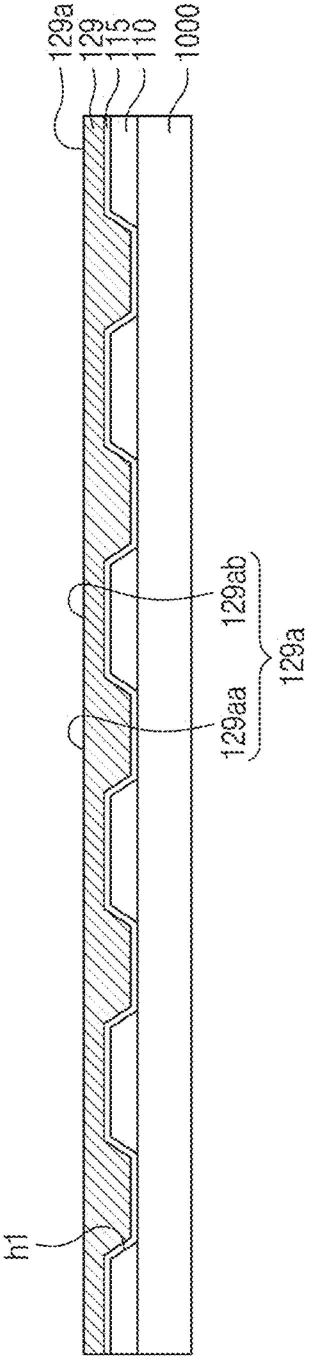

Referring to FIG. 10, a first seed/barrier layer 115 may be formed on the first dielectric layer 110. The first seed/barrier layer 115 may cover a top surface of the first dielectric layer 110. The first seed/barrier layer 115 may conformally cover insides of the first dielectric layer 110 defining the first holes h1. For example, the first seed/barrier layer 115 may be formed along inner lateral surfaces of the first dielectric layer 110 defining sides of the first holes h1 and top surface portions of the carrier substrate 1000 defining bottoms of the first holes h1.

A first conductive layer 129 may be formed on the first seed/barrier layer 115. For example, the first seed/barrier layer 115 may be used as a seed to perform a plating process to form the first conductive layer 129. The plating process may include an electroplating process. The first conductive layer 129 may cover the top surface of the first dielectric layer 110 and may fill the first holes h1. Because the first conductive layer 129 is formed on an entire surface of the first dielectric layer 110, the first conductive layer 129 may be formed to have a flat top surface 129*a*. An increase in thickness of the deposited first conductive layer 129 may induce an increase in flatness of the top surface 129*a*. For example, the thickness of the first conductive layer 129 may be the same as or greater than that of a second conductive pattern 140 which will be formed in a subsequent process.

Figure 11:
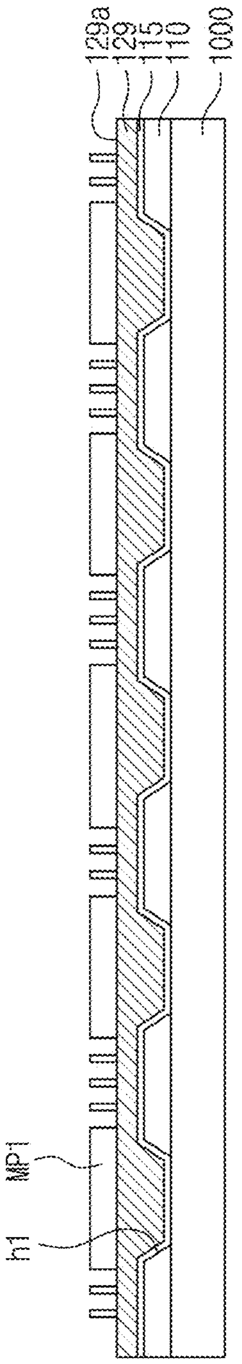

Referring to FIG. 11, a first mask pattern MP1 may be formed on the first conductive layer 129. For example, a photoresist (PR) layer may be formed on the first conductive layer 129, and then may undergo exposure and development processes to form the first mask pattern MP1. The first mask pattern MP1 may have a pattern that exposes the top surface 129*a* of the first conductive layer 129. An area covered with the first mask pattern MP1 may be a region where a first conductive pattern (see 120 of FIG. 12) will be formed as discussed below. For example, the first holes h1 may be covered with the first mask pattern MP1.

Figure 12:
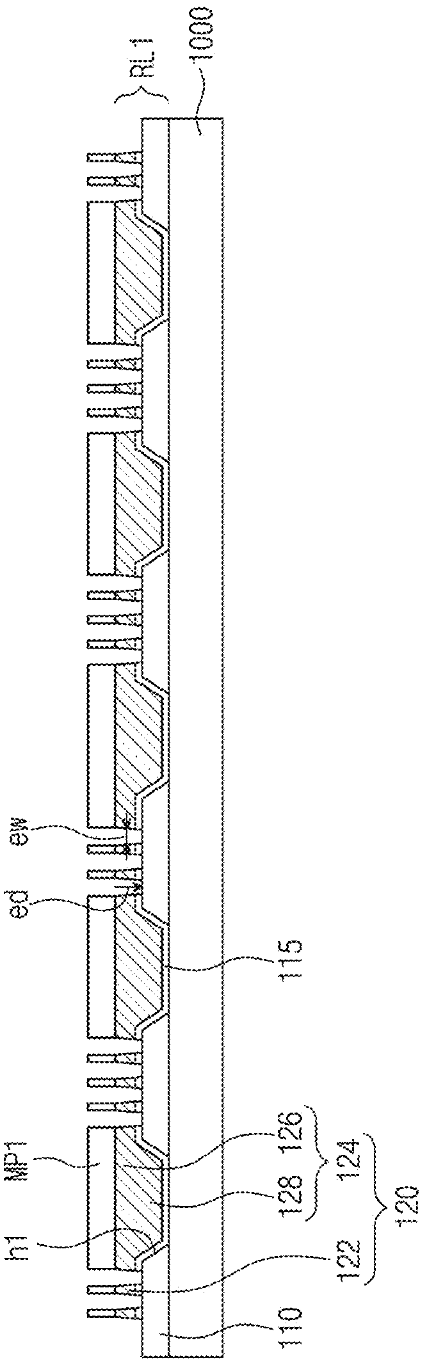

Referring to FIG. 12, the first conductive layer 129 and the first seed/barrier layer 115 may be patterned. For example, the first mask pattern MP1 may be used as an etching mask to perform an etching process on the first conductive layer 129. The first conductive layer 129 may be patterned to form a first conductive pattern 120. For example, the etching process may be performed on the first conductive layer 129, and thus the first conductive layer 129 may be separated into a first wiring pattern 122 and under-bump patterns 124. The etching process may be continuously performed on the first seed/barrier layer 115 exposed by the etching of the first conductive layer 129. The first seed/barrier layer 115 may be patterned to expose the top surface of the first dielectric layer 110. The etching process may allow the first seed/barrier layer 115 to remain only below the first wiring pattern 122 and below the under-bump patterns 124.

As the first mask pattern MP1 is used as an etching mask to perform the etching process to pattern the first conductive layer 129 and the first seed/barrier layer 115, an etching width ew of the etching process may decrease as an etching depth ed of the etching process increases. In some example embodiments, although not shown, an undercut may be formed by over-etching an upper portion of the first conductive layer 129 immediately below the first mask pattern MP1. Therefore, the first wiring pattern 122 positioned on the first dielectric layer 110 and a first head part 126 of the under-bump pattern 124 may be formed to have their lateral surfaces that are inclined relative to the top surface of the first dielectric layer 110. The processes mentioned above may form a first wiring layer RL1 including the first dielectric layer 110 and the first conductive pattern 120.

Figure 13:
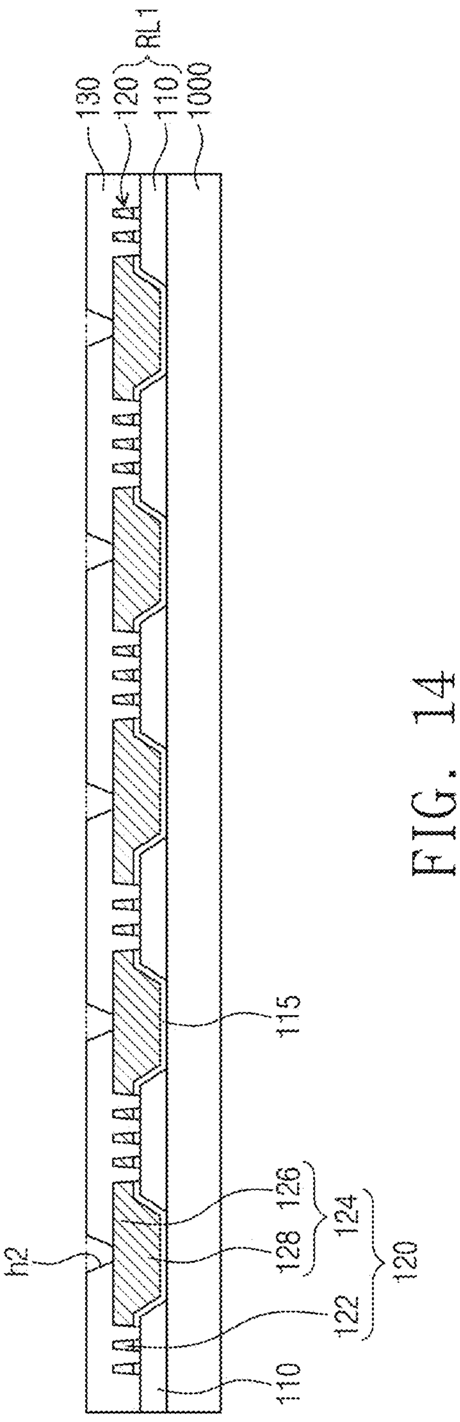

Referring to FIG. 13, a second dielectric layer 130 may be formed on the first dielectric layer 110. The second dielectric layer 130 may be formed by coating and curing a dielectric material on the first dielectric layer 110. The second dielectric layer 130 may cover the first conductive pattern 120. The dielectric material may include a photo-imageable dielectric (PID).

The second dielectric layer 130 may be patterned to form second holes h2. The second holes h2 may expose a top surface of the first conductive pattern 120. The second holes h2 may define areas where second tail parts (see 148 of FIG. 18) of connection patterns (see 144 of FIG. 18) are to be formed in a subsequent process. The second holes h2 may have widths less than those of the first holes h1.

Figure 14:
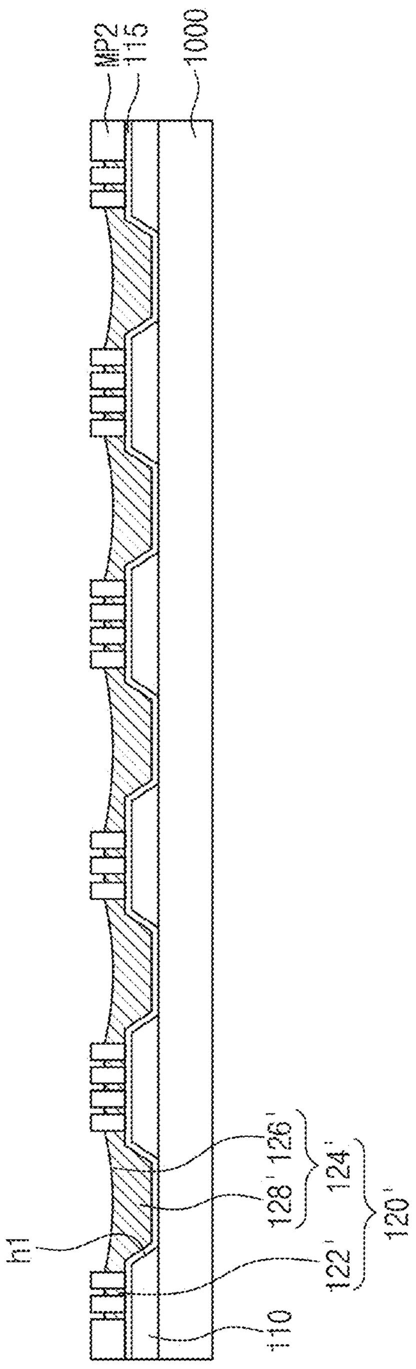
Figure 15:
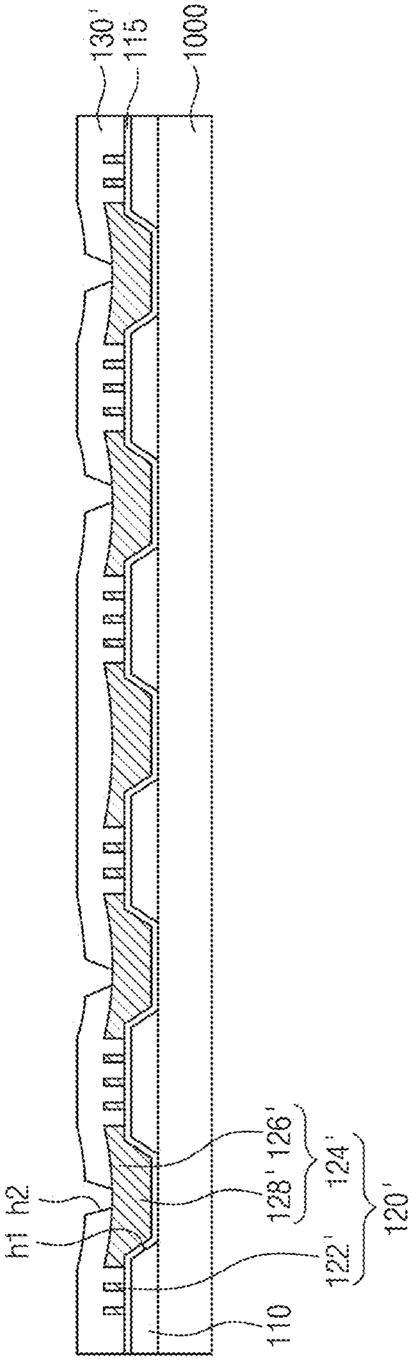

As a semiconductor package increases in integration, a semi additive process (SAP) may be generally used to form wiring layers of a redistribution substrate. FIGS. 14 and 15 show an example in which a semi additive process (SAP) is employed to form a first wiring layer.

Referring to FIG. 14, a first seed/barrier layer 115 may be formed on the first dielectric layer 110 included in a resultant structure of FIG. 9. The first seed/barrier layer 115 may conformally cover the top surface of the first dielectric layer 110 and the insides of the first holes h1.

A second mask pattern MP2 may be formed on the first seed/barrier layer 115. For example, a photoresist (pr) layer may be formed on the first seed/barrier layer 115, and then may undergo exposure and development processes to form the second mask pattern MP2. The second mask pattern MP2 may have a pattern that exposes a top surface of the first seed/barrier layer 115. An area exposed by the second mask pattern MP2 may be a region where a first conductive pattern 120' is formed. For example, the first holes h1 may be exposed by the second mask pattern MP2. As the pattern of the second mask pattern MP2 is formed by exposure and development processes, the pattern of the second mask pattern MP2 may have an inner lateral surface perpendicular to the top surface of the first dielectric layer 110.

A first conductive pattern 120' may be formed on the first seed/barrier layer 115. For example, the first seed/barrier layer 115 may be used as a seed to perform a plating process and spaces defined by the second mask pattern MP2 are filled with a metallic material to form the first conductive pattern 120' including a first wiring pattern 122' and under-bump patterns 124'. The plating process may include an electroplating process. As the inner lateral surface of the pattern of the second mask pattern MP2 is perpendicular to the top surface of the first dielectric layer 110, and a lateral surface of the first wiring pattern 122' in contact with the inner lateral surface of the pattern may be perpendicular to the top surface of the first dielectric layer 110, and likewise a lateral surface of a first head part 126' of the under-bump pattern 124' may be perpendicular to the top surface of the first dielectric layer 110.

When only the first seed/barrier layer 115 exposed by the second mask pattern MP2 is used as a seed for the plating process, an area of the seed of the plating process may be less than an area of the first seed/barrier layer 115. Therefore, a difference in area between the seed and the first seed/barrier layer 115 may induce current crowding issues, and thus a plating thickness may be changed based on position. For example, the under-bump patterns 124' may be formed to have their recessed top surfaces in the first holes h1 where a relatively thick and wide layer should be plated, and the top surfaces of the under-bump patterns 124' may be formed lower than a top surface of the first wiring pattern 122'. In this case, undulation may occur on the first conductive pattern 120'.

Referring to FIG. 15, a second dielectric layer 130' may be formed on the first dielectric layer 110. The second dielectric layer 130' may be formed by coating and curing a dielectric material on the first dielectric layer 110. The second dielectric layer 130' may cover the first conductive pattern 120'. The second dielectric layer 130' may be patterned to form second holes h2. The second holes h2 may expose a top surface of the first conductive pattern 120'. As undulation occurs on the top surface of the first conductive pattern 120', undulation may also occur in the second dielectric layer 130' formed on the first conductive pattern 120'. In this case, an irregular interval may be provided between the first conductive pattern 120' and a second conductive pattern formed on the second dielectric layer 130', and thus a short-circuit may be formed between the first conductive pattern 120' and the second conductive pattern, and delamination may occur between wiring layers.

According to an example embodiment of the present inventive concepts, because the first conductive layer 129 is formed on the entire surface of the first dielectric layer 110 as shown in FIG. 10, the top surface 129*a* of the first conductive layer 129 may be formed flat. For example, the first conductive layer 129 may be formed to allow its top surface 129*aa* on the first hole h1 to lie at the same level as that of its top surface 129*ab* on the first dielectric layer 110. Therefore, a flat top surface may be given to the first wiring pattern (see 122 of FIG. 13) and to each of the under-bump patterns (see 124 of FIG. 13). Patterns 122 and 124 are formed by patterning the first conductive layer 129. Further, the top surface of the first wiring pattern 122 may be located at the same level as that of the top surfaces of the under-bump patterns 124. In this case, no undulation may occur on the first conductive pattern (see 120 of FIG. 13). Moreover, as the top surface of the first conductive pattern 120 is formed flat, no undulation may occur on the second dielectric layer (see 130 of FIG. 13) formed on the first conductive pattern 120. Accordingly, a method of fabricating a semiconductor package according to the example embodiment may reduce the occurrence of defects.

Figure 16:
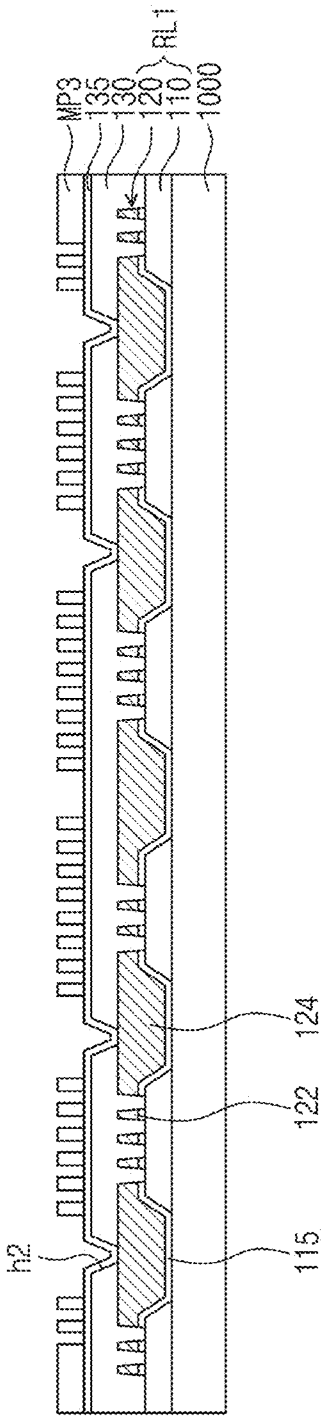

Referring to FIG. 16, a second seed/barrier layer 135 may be formed on the second dielectric layer 130 included in a result structure of FIG. 13. The second seed/barrier layer 135 may cover a top surface of the second dielectric layer 130. The second seed/barrier layer 135 may conformally cover insides of the second holes h2. For example, the second seed/barrier layer 135 may be formed along inner lateral surfaces of second dielectric layer 130 defining sides of the second holes h2 and exposed top surfaces of under-bump patterns 124 defining bottoms of the second holes h2.

A third mask pattern MP3 may be formed on the second seed/barrier layer 135. For example, a photoresist (PR) layer may be formed on the second seed/barrier layer 135, and then may undergo exposure and development processes to form the third mask pattern MP3. The third mask pattern MP3 may have an exposure pattern that exposes a top surface of the second seed/barrier layer 135. An area exposed by the third mask pattern MP3 may be a region where a second conductive pattern (see 140 of FIG. 18) is to be formed as discussed below. For example, the second holes h2 may be exposed by the third mask pattern MP3. As the third mask pattern MP3 is formed by exposure and development processes, an inner lateral surface of the exposure pattern of the third mask pattern MP3 may be perpendicular to the top surface of the second dielectric layer 130.

Figure 17:
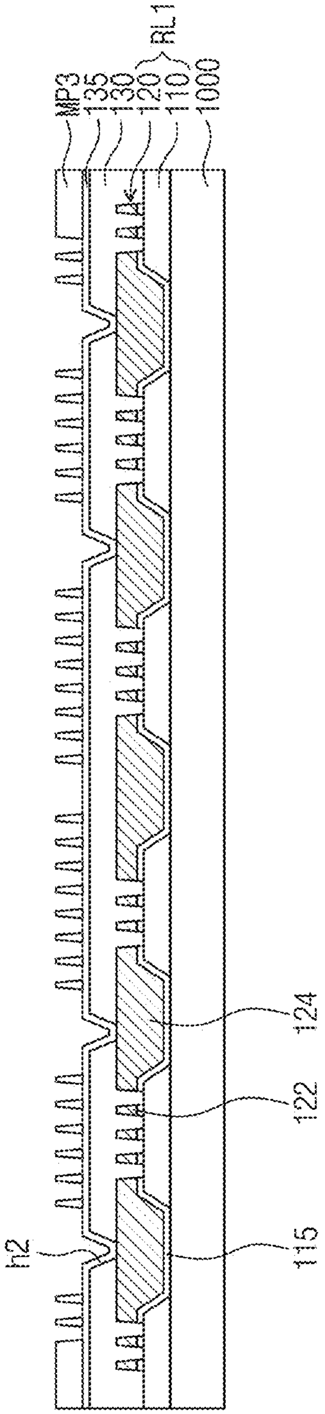

According to an example embodiment, as shown in FIG. 17, a sacrificial layer (not shown) may be formed on the second seed/barrier layer 135, and then the sacrificial layer may be etched to form the third mask pattern MP3. In this case, the third mask pattern MP3 may have a pattern whose inner lateral surface is inclined relative to the top surface of the second dielectric layer 130. For example, the pattern of the third mask pattern MP3 may have a width that decreases in a direction toward a bottom surface of the pattern. In this case, there may be formed a semiconductor package according to the example embodiment of FIG. 3. The following description will focus on the example embodiment of FIG. 16.

Figure 18:
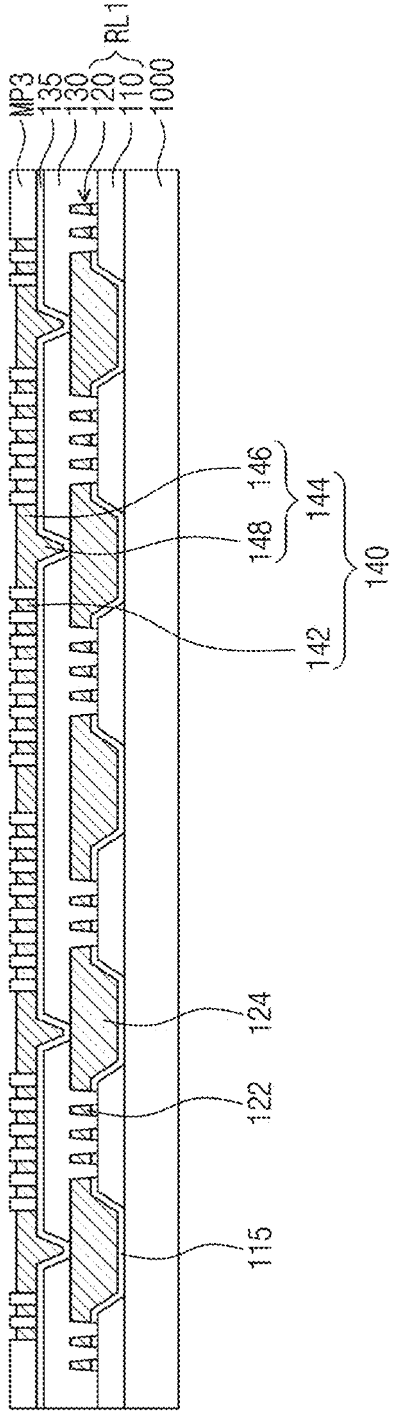

Referring to FIG. 18, a second conductive pattern 140 may be formed on the second seed/barrier layer 135. For example, the second seed/barrier layer 135 may be used as a seed to perform a plating process in which the pattern of the third mask pattern MP3 is filled with a metallic material to form the second conductive pattern 140 that includes a second wiring pattern 142 and first connection patterns 144. The plating process may include an electroplating process. As the inner lateral surface of the pattern of the third mask pattern MP3 is perpendicular to the top surface of the second dielectric layer 130, and a lateral surface of the second wiring pattern 142 in contact with the inner lateral surface of the pattern may be perpendicular to the top surface of the second dielectric layer 130, and likewise a lateral surface of a second head part 146 of the connection pattern 144 may be perpendicular to the top surface of the second dielectric layer 130.

Figure 19:
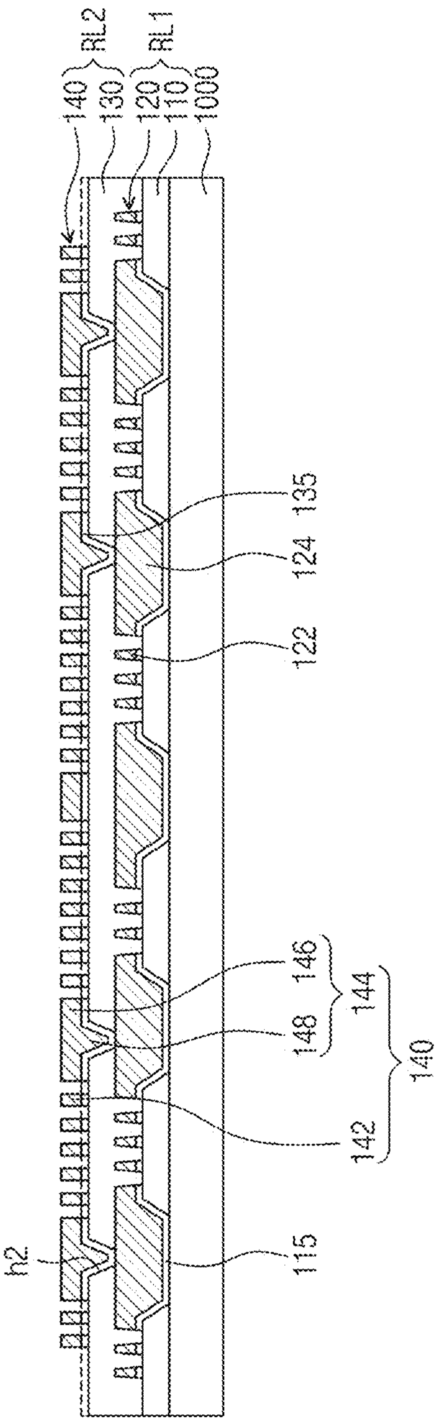

Referring to FIG. 19, the third mask pattern MP3 may be removed. The removal of the third mask pattern MP3 may expose the top surface of the second seed/barrier layer 135. The second conductive pattern 140 may be used as an etching mask to etch the second seed/barrier layer 135. The etching process may allow the second seed/barrier layer 135 to remain only below the second wiring pattern 142 and below the connection patterns 144. The processes mentioned above may form a second wiring layer RL2 including the second dielectric layer 130 and the second conductive pattern 140.

As regards the third mask pattern MP3 formed by exposing and developing a photoresist layer, it may be possible to easily form a fine pattern and to increase integration of the second conductive pattern 140 formed of a conductive material that fills the spaces defined by the third mask pattern MP3. Because the connection patterns 144 has a width smaller than that of the under-bump pattern 124, there may be less occurrence of undulation on the connection patterns 144.

According to an example embodiment of the present inventive concepts, the first wiring layer RL1, in which under-bump patterns 124 having large widths are formed, may be formed to avoid undulation, and high integration may be given to the second wiring layer RL2, in which the connection patterns 144 each having small widths are formed. Accordingly, a semiconductor package may be fabricated to have both increased structural stability and increased electrical properties.

Figure 20:
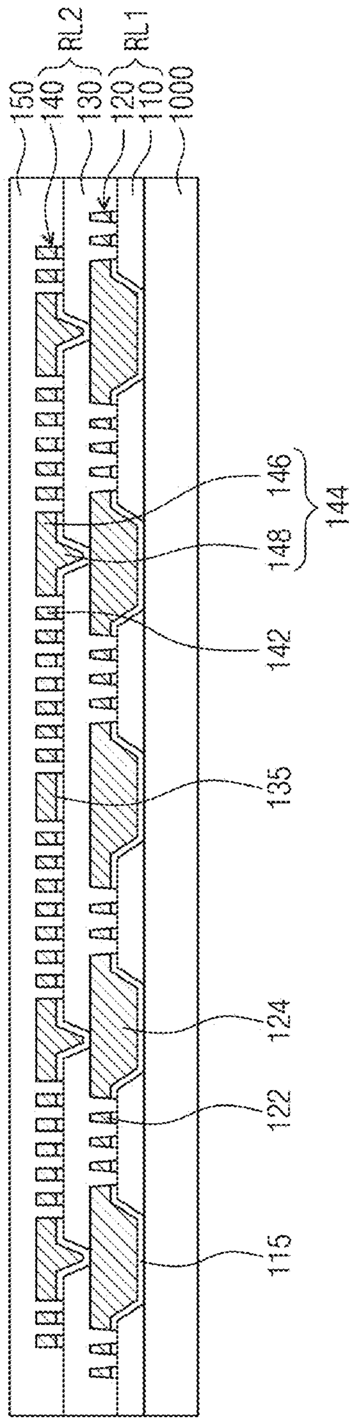

Referring to FIG. 20, a third dielectric layer 150 may be formed on the second dielectric layer 130. The third dielectric layer 150 may be formed by coating and curing a dielectric material on the second dielectric layer 130. The third dielectric layer 150 may cover the second conductive pattern 140. The dielectric material may include a photo-imageable dielectric (PID).

Figure 21:
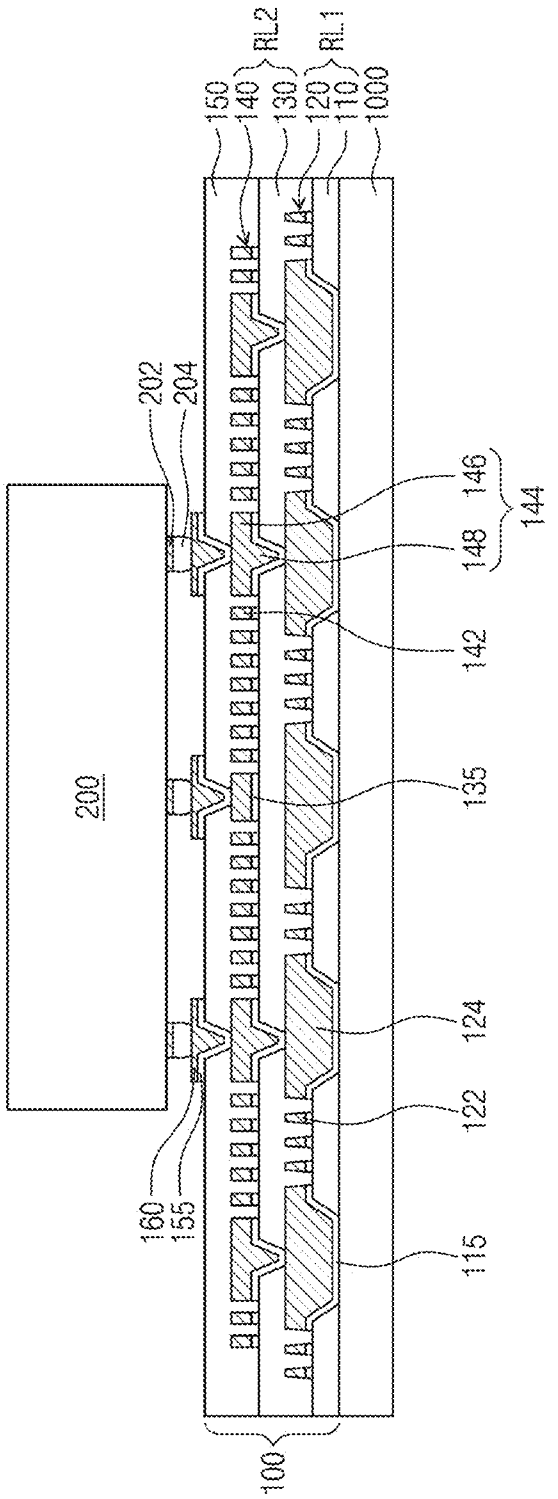

Referring to FIG. 21, one or more upper substrate pads 160 may be formed on the third dielectric layer 150. For example, the third dielectric layer 150 may be patterned to form a third hole that exposes the second conductive pattern 140, a seed/barrier layer and a conductive layer may be formed on the third dielectric layer 150, and then the seed/barrier layer and the conductive layer may be patterned to form a third seed/barrier layer 155 and an upper substrate pad 160. A redistribution substrate 100 may be constituted by the first wiring layer RL1, the second wiring layer RL2, the third dielectric layer 150, and the upper substrate pad 160.

A semiconductor chip 200 may be mounted on the redistribution substrate 100. For example, the semiconductor chip 200 may be flip-chip mounted on the redistribution substrate 100. The semiconductor chip 200 may have chip pads 202 provided on a bottom surface of the semiconductor chip 200. The chip pads 202 may be electrically connected to an integrated circuit in the semiconductor chip 200. The semiconductor chip 200 may be provided with chip connection terminals 204 on the bottom surface thereof. The chip connection terminals 204 may connect the chip pads 202 to the upper substrate pads 160.

Referring back to FIG. 1, a molding layer 300 may be formed on the redistribution substrate 100. For example, a dielectric material may be coated on the redistribution substrate 100 to cover the semiconductor chip 200, and then the dielectric material may be cured to form the molding layer 300. For example, the dielectric material may include an epoxy molding compound (EMC).

A protection layer 102 may be formed on a bottom surface of the redistribution substrate 100. For example, the carrier substrate 1000 may be removed to expose a bottom surface of the first wiring layer RL1. The protection layer 102 may be formed by depositing a dielectric material on the bottom surface of the first wiring layer RL1. For example, the dielectric material may include silicon oxide (SiO), silicon nitride (SiN), silicon oxynitride (SiON), or dielectric polymers. Afterwards, the protection layer 102 may be patterned to expose a bottom surface of the under-bump pattern 124.

The redistribution substrate 100 may be provided with substrate terminals 105 on the bottom surface thereof. For example, the substrate terminals 105 may be disposed on the under-bump patterns 124 exposed by the protection layer 102. The substrate terminals 105 may include solder balls or solder bumps.

For a semiconductor package according to an example embodiment of the present inventive concepts, a first wiring layer may have a first conductive pattern that is flat, and no undulation may occur on the first wiring layer including an under-bump pattern. A second wiring layer provided on the first wiring layer may have a second conductive pattern that is also flat, and no undulation may occur on the second wiring layer. A uniform interval may be provided between the first conductive pattern and the second conductive pattern. Therefore, no short-circuit may occur between the first conductive pattern and the second conductive pattern, and a semiconductor package may increase in electrical properties and drive reliability.

In addition, according to an example embodiment of the present inventive concepts, the first and second wiring layers each having a flat shape may be robust to deformation caused by external force. Thus, a semiconductor package may have increased structural stability.

In a method of fabricating a semiconductor package according to an example embodiment of the present inventive concepts, the first wiring pattern and the under-bump pattern may be formed to have flat top surfaces, and thus no undulation may occur on the first conductive pattern. In addition, no undulation may occur on a second dielectric layer formed on the first conductive pattern. Accordingly, the method of fabricating a semiconductor package may reduce the occurrence of defects.

Moreover, no undulation may occur on the first wiring layer in which the under-bump pattern having a large width is formed, and high integration may be given to the second wiring layer, in which a connection pattern having a small width is formed. Accordingly, there may be fabricated a semiconductor package with both increased structural stability and increased electrical properties.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor package, comprising:
a lower substrate;
a lower semiconductor chip mounted on the lower substrate;
a redistribution layer on the lower semiconductor chip;
an upper semiconductor chip mounted on the redistribution layer; and
a through electrode on one side of the lower semiconductor chip, the through electrode connecting the lower substrate to the redistribution layer,
wherein the lower substrate includes,
a first dielectric layer,
a first conductive pattern on the first dielectric layer, the first conductive pattern having a wiring pattern and an under-bump pattern, wherein the wiring pattern and the under-bump pattern are horizontally spaced apart from each other, wherein the wiring pattern is above a top surface of the first dielectric layer, and wherein the under-bump pattern extends from the top surface of the first dielectric layer at least partially through the first dielectric layer,
a second dielectric layer on the first dielectric layer, the second dielectric layer covering the first conductive pattern, and
a second conductive pattern on the second dielectric layer,
wherein the under-bump pattern includes,
a first head part horizontally extending on the first dielectric layer, and
a first tail part vertically penetrating the first dielectric layer and being exposed on a bottom surface of the first dielectric layer,
wherein the first head part of the under-bump pattern has a first lateral surface on the first dielectric layer, the first lateral surface being inclined relative to the top surface of the first dielectric layer,
wherein the second conductive pattern has a second lateral surface on the second dielectric layer, the second lateral surface being perpendicular to a top surface of the second dielectric layer, and
wherein the second conductive pattern includes
a second head part horizontally extending over the second dielectric layer, and
a second tail part vertically penetrating the second dielectric layer and coupled to the first conductive pattern, wherein the second lateral surface is a lateral surface of the second head part.

2. The semiconductor package of claim 1, wherein
an angle between the first lateral surface and a bottom surface of the first head part included in the under-bump pattern is 45° to 89°, and
an angle between the second lateral surface and a bottom surface of the second conductive pattern is 90°.

3. The semiconductor package of claim 1, wherein a top surface of the wiring pattern is at a same level as a level of a top surface of the under-bump pattern.

4. The semiconductor package of claim 1, wherein a top surface of the under-bump pattern is parallel to the top surface of the first dielectric layer.

5. The semiconductor package of claim 1, wherein a thickness of the first head part included in the under-bump pattern is uniform irrespective of horizontal position.

6. The semiconductor package of claim 1, wherein the first head part and the first tail part of the under-bump pattern are connected to each other to constitute a T shape.

7. The semiconductor package of claim 1, wherein
an angle between a third lateral surface of the first tail part included in the under-bump pattern and the top surface of the first dielectric layer is 45° to 89°, and
an angle between a fourth lateral surface of the second tail part included in the second conductive pattern and the top surface of the second dielectric layer is 45° to 89°.

8. The semiconductor package of claim 1, wherein the wiring pattern has a third lateral surface on the first dielectric layer, the third lateral surface being inclined relative to the top surface of the first dielectric layer.

9. The semiconductor package of claim 8, wherein
a bottom surface of the wiring pattern is at a same level as a level of a bottom surface of the first head part included in the under-bump pattern, and
an angle between the first lateral surface and the bottom surface of the first head part is same as an angle between the third lateral surface and the bottom surface of the wiring pattern.

10. The semiconductor package of claim 1, further comprising:
an external terminal on a bottom surface of the under-bump pattern that is exposed on the bottom surface of the first dielectric layer.

11. A semiconductor package, comprising:
a package substrate;
an interposer substrate mounted on the package substrate, the interposer substrate electrically connected to the package substrate through a substrate terminal;
a chip stack on the interposer substrate, the chip stack including a plurality of first semiconductor chips that are vertically stacked; and
a second semiconductor chip on the interposer substrate, the second semiconductor chip horizontally spaced apart from the chip stack,
wherein the interposer substrate includes,
a first dielectric layer,
an under-bump pattern penetrating the first dielectric layer and exposed on a bottom surface of the first dielectric layer, the under-bump pattern protruding onto the first dielectric layer,
a second dielectric layer on the first dielectric layer and covering the under-bump pattern,
a conductive pattern on the second dielectric layer and electrically connected to the under-bump pattern, and
a third dielectric layer on the second dielectric layer and covering the conductive pattern,
wherein the substrate terminal is on a bottom surface of the under-bump pattern that is exposed on the bottom surface of the first dielectric layer,
wherein a head part of the under-bump pattern horizontally extends on the first dielectric layer and has a first lateral surface that is inclined relative to a top surface of the first dielectric layer,
wherein the conductive pattern has a second lateral surface on the second dielectric layer and inclined relative to the first lateral surface, and
wherein a top surface of the under-bump pattern is parallel to the top surface of the first dielectric layer.

12. The semiconductor package of claim 11, wherein
the interposer substrate further includes a wiring pattern on the first dielectric layer, the wiring pattern being spaced apart from the under-bump pattern,
the wiring pattern horizontally extends on the first dielectric layer, and a top surface of the wiring pattern is at a same level as a level of the top surface of the under-bump pattern.

13. The semiconductor package of claim 11, wherein the second lateral surface of the conductive pattern is on the second dielectric layer and is perpendicular to a top surface of the second dielectric layer.

14. The semiconductor package of claim 13, wherein an angle between the first lateral surface and a bottom surface of the head part included in the under-bump pattern is 45° to 89°, and an angle between the second lateral surface and a bottom surface of the conductive pattern is 90°.

15. The semiconductor package of claim 11, wherein a thickness of the head part included in the under-bump pattern is uniform irrespective of horizontal position.

16. The semiconductor package of claim 11, wherein a tail part of the under-bump pattern and the head part of the under-bump pattern are connected to each other to constitute a T shape, the tail part vertically penetrating the first dielectric layer and being exposed on the bottom surface of the first dielectric layer.

17. A method of fabricating a semiconductor package, the method comprising:

forming a first wiring layer including an under-bump pattern;

forming a second wiring layer on the first wiring layer;

forming a substrate pad on the second wiring layer;

mounting a semiconductor chip on the substrate pad; and providing a connection terminal below the under-bump pattern, wherein forming the first wiring layer includes forming a first dielectric layer, patterning the first dielectric layer to define a first hole penetrating therethrough;

forming a conductive layer to cover the first dielectric layer and to fill the first hole, forming a first mask pattern on the conductive layer, and forming the under-bump pattern by using the first mask pattern as an etching mask to etch the conductive layer, wherein forming the second wiring layer includes forming a second dielectric layer on the first dielectric layer to cover the under-bump pattern, patterning the second dielectric layer to define a second hole penetrating therethrough and to expose the under-bump pattern, forming a second mask pattern on the second dielectric layer, the second mask pattern having an exposure pattern that exposes the second hole, and forming a conductive pattern by filling the second hole and the exposure pattern with a conductive material, wherein a lateral surface of the under-bump pattern on the first dielectric layer is inclined relative to a top surface of the first dielectric layer, and wherein a lateral surface of the conductive pattern on the second dielectric layer is perpendicular to a top surface of the second dielectric layer.

18. The method of claim 17, wherein the forming a conductive layer includes, forming a first seed layer covering the top surface of the first dielectric layer and an inner lateral surface of the first dielectric layer defining the first hole, and performing a plating process using the first seed layer as a seed, and the forming a conductive pattern includes, forming a second seed layer covering an inner lateral surface of the second dielectric layer defining the second hole and a bottom surface of the exposure pattern of the second mask pattern, and performing a plating process using the second seed layer as a seed.

19. The method of claim 17, wherein the forming a conductive layer forms the conductive layer such that a top surface of the conductive layer is a flat surface parallel to the top surface of the first dielectric layer, and the forming a second dielectric layer forms the second dielectric layer before patterning the second dielectric layer such that the top surface of the second dielectric layer is a flat surface parallel to the top surface of the first dielectric layer.

* * * * *